US 8,778,758 B2
Jul. 15, 2014

(12) United States Patent
Kubota

(10) Patent No.: US 8,778,758 B2
(45) Date of Patent: Jul. 15, 2014

(54) METHOD FOR MANUFACTURING SEMICONDUCTOR DEVICE AND SEMICONDUCTOR DEVICE

(71) Applicant: Hiroshi Kubota, Mie-ken (JP)

(72) Inventor: Hiroshi Kubota, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/692,156

(22) Filed: Dec. 3, 2012

(65) Prior Publication Data
US 2014/0061761 A1 Mar. 6, 2014

Related U.S. Application Data

(60) Provisional application No. 61/695,053, filed on Aug. 30, 2012.

(51) Int. Cl.
*H01L 21/336* (2006.01)
(52) U.S. Cl.
USPC ........... 438/257; 438/314; 438/315; 438/390; 438/222; 257/134; 257/135
(58) Field of Classification Search
USPC .......... 438/257, 314, 315, 390, 222; 257/134, 257/135
See application file for complete search history.

(56) References Cited

U.S. PATENT DOCUMENTS

| 2006/0060971 A1* | 3/2006 | Ning .............................. 257/758 |
| 2006/0091475 A1 | 5/2006 | Fujii et al. |
| 2008/0230831 A1* | 9/2008 | Noda et al. .................... 257/325 |
| 2008/0246075 A1* | 10/2008 | Matsuno ....................... 257/316 |
| 2009/0014771 A1* | 1/2009 | Ide et al. ....................... 257/315 |
| 2011/0309517 A1 | 12/2011 | Miki et al. |

FOREIGN PATENT DOCUMENTS

| JP | 2010-40753 | 2/2010 |
| JP | 2010-87160 | 4/2010 |

OTHER PUBLICATIONS

U.S. Appl. No. 61/695,053, filed Aug. 30, 2012, Hiroshi Kubota.

* cited by examiner

*Primary Examiner* — Kyoung Lee
*Assistant Examiner* — Ratisha Mehta
(74) *Attorney, Agent, or Firm* — Oblon, Spivak, McClelland, Maier & Neustadt, L.L.P.

(57) ABSTRACT

According to one embodiment, a method for manufacturing a semiconductor device includes forming a plurality of electrode structures above a substrate. The method includes forming an insulating film on the plurality of electrode structures to make a gap between mutually-adjacent electrode structures. The method includes forming a silicon nitride film having compressive stress above the insulating film. The method includes forming a planarization film above the silicon nitride film. The method includes planarizing a surface of the planarization film by polishing by CMP (chemical mechanical polishing) method.

7 Claims, 21 Drawing Sheets

US 8,778,758 B2

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from U.S. Provisional Patent Application 61/695,053, filed on Aug. 30, 2012; the entire contents of which are incorporated herein by reference.

FIELD

Embodiments described herein relate generally to a method for manufacturing a semiconductor device and a semiconductor device.

BACKGROUND

In recent years, technology to make a gap between interconnects without filling an insulating film has been developed to suppress the electrical interference between the interconnects as the downscaling of semiconductor devices progresses. However, because there is a tendency for the mechanical strength to decrease for the device structure in which such a gap is formed, there are cases where the occurrence of damage is problematic when planarizing the upper portion of the device structure by CMP (chemical mechanical polishing) technology in the manufacture of the semiconductor device.

DETAILED DESCRIPTION

Figure 1:
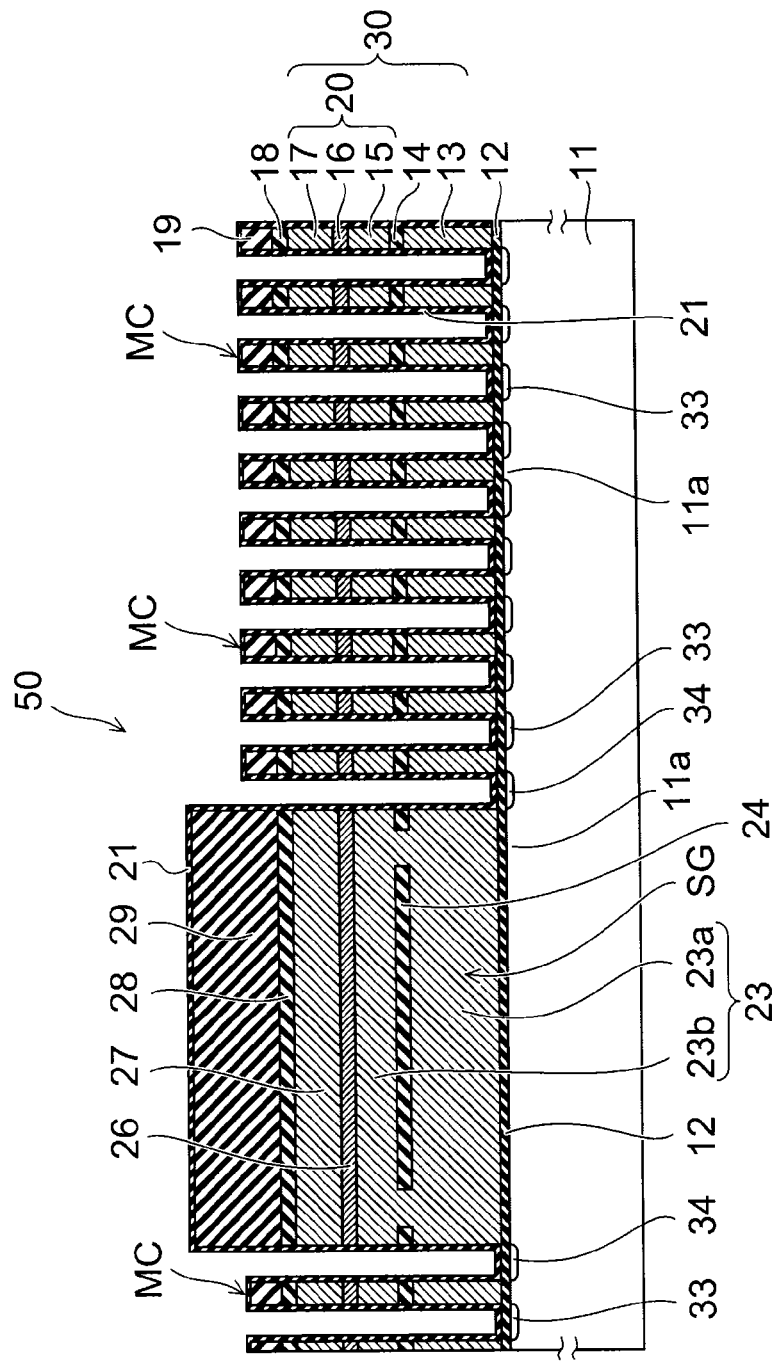
FIGS. 1 to 10 are schematic cross-sectional views showing a method for manufacturing a semiconductor device of a first embodiment.

According to one embodiment, a method for manufacturing a semiconductor device includes forming a plurality of electrode structures above a substrate. The method includes forming an insulating film on the plurality of electrode structures to make a gap between mutually-adjacent electrode structures. The method includes forming a silicon nitride film having compressive stress above the insulating film. The method includes forming a planarization film above the silicon nitride film. The method includes planarizing a surface of the planarization film by polishing by CMP (chemical mechanical polishing) method.

For example, a silicon nitride film can be used as a stopper film of the polishing when polishing a silicon oxide film by CMP method. However, scratches that reach the circuit structure of the substrate surface occur easily by extending through the silicon oxide film and the silicon nitride film when the polishing reaches the silicon nitride film which has a polishing rate that is qualitatively slower than that of the silicon oxide film.

For example, in a memory device in which multiple gate electrodes are provided on the substrate, the scratches that occur during the CMP may cause damage to many of the gate electrodes as the pattern is downscaled because many gate electrodes are arranged with high density.

So-called blind CMP technology is known in which planarizing is performed by stopping the polishing of the silicon oxide film partway through the silicon oxide film without using the silicon nitride film as the stopper film by improving the controllability of the polishing stop timing. However, in blind CMP technology as well, the state of the art is such that the scratches occurring when polishing the silicon oxide film cannot be eliminated completely.

Embodiments will now be described with reference to the drawings. Similar components in the drawings are marked with like reference numerals.

First Embodiment

Figure 10:
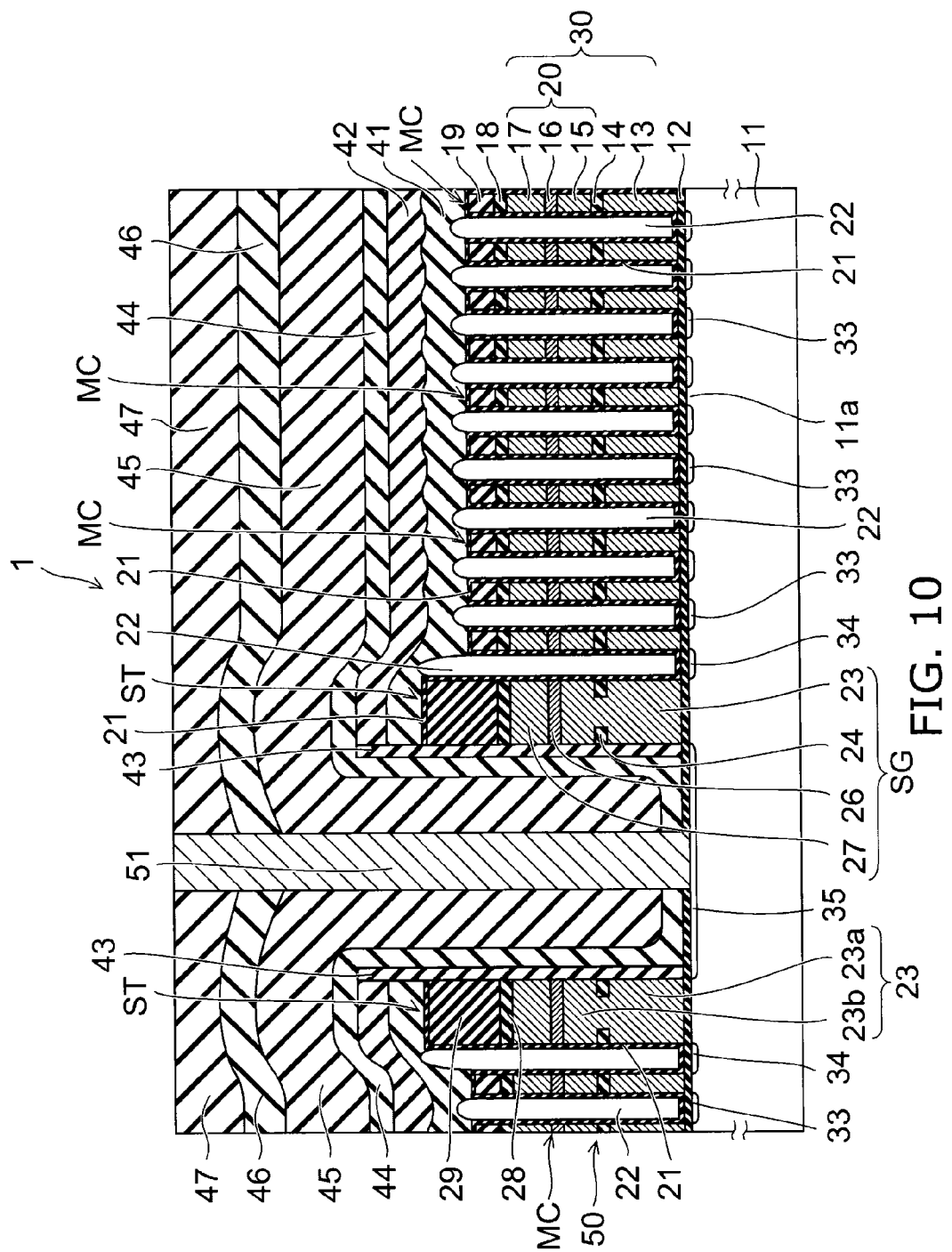

FIG. 10 is a schematic cross-sectional view of a semiconductor device 1 of a first embodiment.

The semiconductor device 1 includes a substrate 11, a foundation structure 50 provided on the substrate 11, and an upper layer structure provided on the foundation structure 50. The semiconductor device 1 is, for example, a nonvolatile semiconductor memory device; and the foundation structure 50 includes multiple memory cells MC and select transistors ST as circuit elements. A gap 22 is provided between the memory cells MC and between the select transistor ST and the memory cell MC.

The substrate 11 is, for example, a silicon substrate; and an active region (or a channel region) 11a is formed at the surface of the substrate 11 or at the surface of a semiconductor well layer formed at the surface of the substrate 11. Source/drain regions 33, 34, and 35 having a conductivity type opposite to the active region 11a are formed selectively in the active region 11a.

An insulating film 12 is provided on the active region 11a. The insulating film 12 is, for example, a silicon oxide film. The multiple memory cells MC are provided on the insulating film 12 and are separated from each other. The memory cell MC includes an electrode structure 30 provided on the insulating film 12.

The electrode structure 30 includes a charge storage layer 13 provided on the insulating film 12, an intermediate insulating film 14 provided on the charge storage layer 13, and a control electrode 20 provided on the intermediate insulating film 14.

The charge storage layer 13 is a floating electrode, a trap insulating film, or a stacked film of a floating electrode and a trap insulating film. In the description of the first embodiment, a floating electrode made of a polycrystalline silicon layer is described as the charge storage layer 13.

The control electrode 20 includes a polycrystalline silicon layer 15 provided on the intermediate insulating film 14, a metal nitride layer 16 provided on the polycrystalline silicon layer 15, and a metal layer 17 provided on the metal nitride layer 16. For example, the metal layer 17 is a tungsten layer; and the metal nitride layer 16 is a tungsten nitride layer. The metal nitride layer 16 blocks the metal (the tungsten) of the metal layer 17 from diffusing to layers lower than the metal layer 17.

A silicon nitride film 18 is provided on the metal layer 17; and a silicon oxide film 19 is provided on the silicon nitride film 18. The silicon nitride film 18 and the silicon oxide film 19 are used as a mask for patterning the electrode structure 30 and are left as-is on the metal layer 17.

For example, a silicon oxide film is provided as an insulating film 21 at the side wall of the electrode structure 30.

The multiple active regions 11a are formed at the surface of the substrate 11; and each of the active regions 11a extends in the lateral direction of FIG. 10. The active regions 11a and the control electrodes 20 cross (e.g., are orthogonal) when the substrate 11 is viewed in plan from above in FIG. 10; and the charge storage layers 13 are positioned at the intersections of the active regions 11a and the control electrodes 20. In other words, the multiple memory cells MC are laid out in a matrix configuration on the substrate 11; and one memory cell MC includes one charge storage layer 13 enclosed with an insulator (including gaps).

The charge storage layer 13 is covered with an insulator and has no electrical connections. Therefore, even when the power supply is OFF, the electrons stored in the charge storage layer 13 do not leak out from the charge storage layer 13; and new electrons do not enter. In other words, the semiconductor device 1 of the embodiment is a nonvolatile semiconductor memory device that can retain data without supplying the power supply.

The gap 22 having a relative dielectric constant that is lower than that of the silicon oxide film is provided between the multiple memory cells MC to suppress the interference between the memory cells MC.

The multiple memory cells MC are connected in series in the direction (in FIG. 10, the lateral direction) in which the active region 11a extends and are included in a cell column. The mutually-adjacent memory cells MC share the source/drain region 33 formed in the active region 11a.

The select transistors ST including select gates SG are connected to the two ends of the cell column. The cell column and the select transistors ST are connected in series between a not-shown bit line and a not-shown source line and are included in a memory string.

The select gate SG includes a polycrystalline silicon layer 23 provided on the insulating film 12, a metal nitride layer 26 provided on the polycrystalline silicon layer 23, and a metal layer 27 provided on the metal nitride layer 26.

The polycrystalline silicon layer 23 includes a lower layer portion 23a formed by the same process as the charge storage layer (the floating electrode) 13 of the memory cell MC and an upper layer portion 23b formed by the same process as the polycrystalline silicon layer 15 of the memory cell MC.

An intermediate insulating film 24 formed by the same process as the intermediate insulating film 14 of the memory cell MC is provided between the upper layer portion 23b and the lower layer portion 23a of the polycrystalline silicon layer 23 of the select gate SG. However, in the select gate SG, a portion of the intermediate insulating film 24 has an opening; and the upper layer portion 23b and the lower layer portion 23a of the polycrystalline silicon layer 23 are shorted to each other.

The metal nitride layer 26 of the select gate SG is formed of the same material (e.g., tungsten nitride) as the metal nitride layer 16 of the memory cell MC and by the same process as the metal nitride layer 16 of the memory cell MC.

The metal layer 27 of the select gate SG is formed of the same material (e.g., tungsten) as the metal layer 17 of the memory cell MC and by the same process as the metal layer 17 of the memory cell MC.

A silicon nitride film 28 formed by the same process as the silicon nitride film 18 of the memory cell MC is provided on the metal layer 27 of the select gate SG; and a silicon oxide film 29 formed by the same process as the silicon oxide film 19 of the memory cell MC is provided on the silicon nitride film 28. Then, the select gate SG is patterned using the silicon nitride film 28 and the silicon oxide film 29 as a mask.

The select gate SG is provided on the active region 11a between mutually-adjacent cell columns with the insulating film 12 interposed between the select gate SG and the active region 11a.

The source/drain region 35 is formed in the active region 11a between the mutually-adjacent select gates SG. The source/drain region 34 is formed in the active region 11a between the memory cell MC and the select gate SG of the end of the cell column.

A pair of the select gates SG is provided with the source/drain region 35 interposed; and the select gates SG make it possible to respectively connect different cell columns to a common upper layer interconnect (a bit line or a source line).

A via 51 that reaches the source/drain region 35 is provided in a buried film 45 described below that is filled between the mutually-adjacent select gates SG. The memory string is electrically connectable to the not-shown upper layer interconnect (the bit line or the source line) by the via 51.

The insulating film 21 is provided at one of the side walls of the stacked body including the select gate SG, the silicon nitride film 28, and the silicon oxide film 29; and an insulating film 43 is provided at one other side wall. The insulating film 21 and the insulating film 43 are, for example, silicon oxide films.

The buried film 45 is filled between the mutually-adjacent select gates SG. The buried film 45 is an insulating film, e.g., a silicon oxide film.

A silicon nitride barrier film 44 is provided between the buried film 45 and the insulating film 43 provided at the side wall of the select gate SG. The silicon nitride barrier film 44 is provided also on the insulating film 12 between the select gates SG. The silicon nitride barrier film 44 is provided also on an insulating film 42 described below that is provided on the foundation structure 50 including the memory cells MC, the select transistors ST, and the gap 22. The silicon nitride barrier film 44 blocks the diffusion of impurities of the processes subsequent to the forming of the silicon nitride barrier film 44.

An insulating film 41 is provided on the foundation structure 50. The insulating film 41 is, for example, a silicon oxide film. By controlling the film formation conditions of the insulating film 41, the insulating film 41 can be formed on the memory cells MC and on the select transistors ST to make the gap 22 between the memory cells MC and between the select transistor ST and the memory cell MC.

The insulating film 42 is provided on the insulating film 41. The insulating film 42 is a silicon oxide film. The insulating film 42 is used as, for example, a mask for patterning the peripheral circuit and is left on the insulating film 41.

The silicon nitride barrier film 44 that is described above is provided on the insulating film 42. The silicon nitride barrier film 44 is a silicon nitride film having tensile stress formed by thermal CVD (chemical vapor deposition) method as described below.

The buried film 45 is provided on the silicon nitride barrier film 44. The buried film 45 is, for example, a silicon oxide film. The buried film 45 is filled between mutually-adjacent select gates SG.

A silicon nitride film 46 is provided on the buried film 45. As described below, the silicon nitride film 46 is formed by plasma CVD and has compressive stress. The Young's modulus of the silicon nitride film 46 is higher than that of the silicon oxide film; and the silicon nitride film 46 is harder than the silicon oxide film.

A planarization film 47 is provided on the silicon nitride film 46. The planarization film 47 is, for example, a silicon oxide film. The surface (the top surface) of the planarization film 47 is planarized by polishing by CMP method as described below.

The method for manufacturing the semiconductor device 1 of the first embodiment will now be described with reference to FIGS. 1 to 10.

FIG. 1 shows the state in which the foundation structure 50 is formed on the substrate 11.

After forming the active region 11a at the surface of the substrate 11, the insulating film 12 is formed on the active region 11a.

A polycrystalline silicon layer that is used to form the charge storage layer 13 of the memory cell MC and the lower layer portion 23a of the polycrystalline silicon layer 23 of the select gate SG is formed on the insulating film 12.

An insulating film that is used to form the intermediate insulating film 14 of the memory cell MC and the intermediate insulating film 24 of the select gate SG is formed on the polycrystalline silicon layer. A portion of the intermediate insulating film 24 has an opening.

Polycrystalline silicon that is used to form the polycrystalline silicon layer 15 of the memory cell MC and the upper layer portion 23b of the polycrystalline silicon layer 23 of the select gate SG is formed on the insulating film. The polycrystalline silicon is filled also into the opening made in the intermediate insulating film 24.

A metal nitride that is used to form the metal nitride layer 16 of the memory cell MC and the metal nitride layer 26 of the select gate SG is formed on the polycrystalline silicon.

A metal that is used to form the metal layer 17 of the memory cell MC and the metal layer 27 of the select gate SG is formed on the metal nitride.

The silicon nitride film 18 is formed on the metal layer 17; and the silicon nitride film 28 is formed on the metal layer 27.

The silicon oxide film 19 is formed on the silicon nitride film 18; and the silicon oxide film 29 is formed on the silicon nitride film 28.

Then, a not-shown resist film is formed on the silicon oxide films 19 and 29; after patterning the resist film, the stacked body described above under the resist film is patterned as shown in FIG. 1 by progressively etching using the resist film as a mask. In other words, the stacked body recited above on the substrate 11 is divided into the multiple memory cells MC and the stacked body that includes the select gate SG.

The insulating film (the silicon oxide film) 21 is formed conformally on the side wall and the upper surface of the stacked body that is patterned.

The source/drain regions 33 and 34 are formed by implanting an impurity into the active region 11a by ion implantation method using the stacked body that is patterned as a mask.

Figure 2:
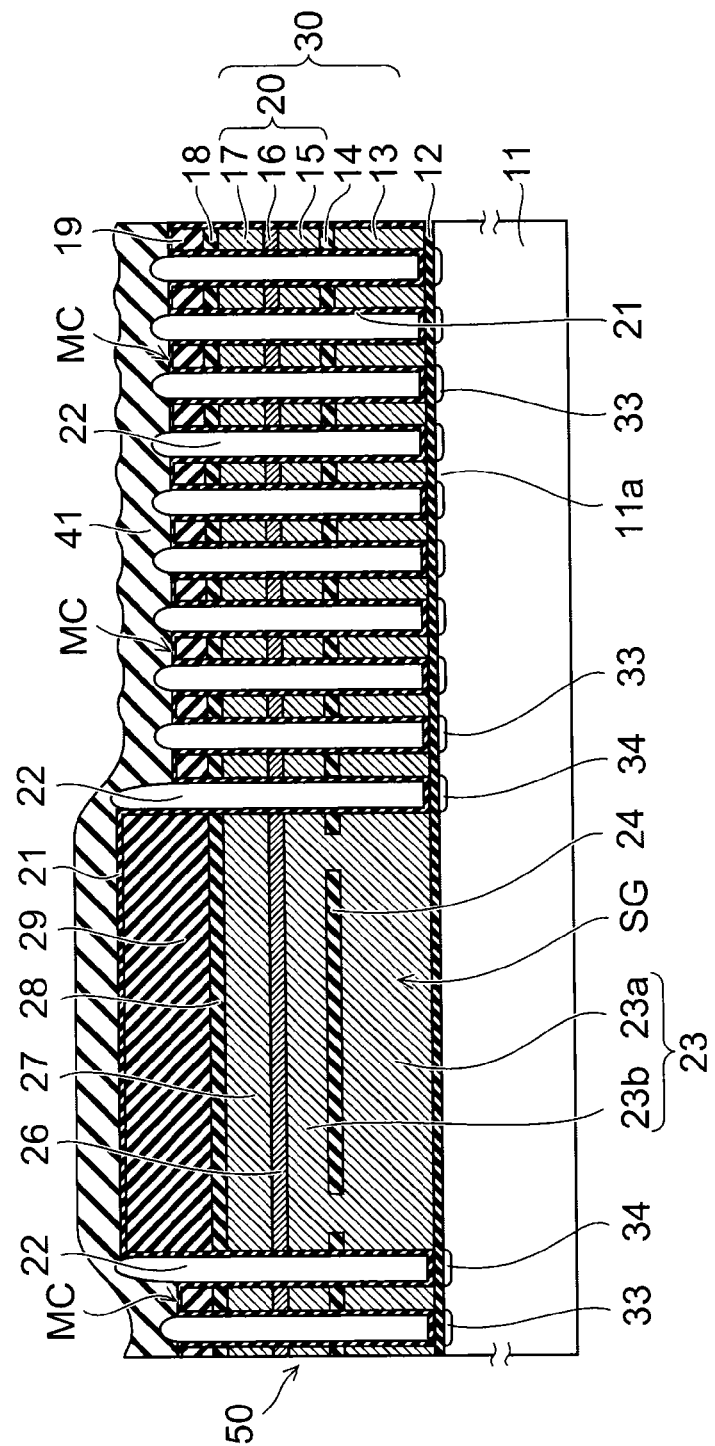

Then, as shown in FIG. 2, the insulating film 41 is formed on the foundation structure 50 obtained in the process of FIG. 1. By controlling the film formation conditions of the insulating film 41, the insulating film 41 can be formed on each of the stacked bodies to make the gap 22 between the stacked bodies that are separated.

A silicon oxide film (a SiO$_2$ film) is formed as the insulating film 41 by, for example, plasma CVD method using SiH$_4$ and N$_2$O as the source gases. The silicon oxide film formed by this film formation method has poor fillability into trenches and holes; and the formation of the gap 22 is possible.

Or, the formation of the gap 22 is possible even in the case where a SiON film is formed as the insulating film 41 by plasma CVD method.

Figure 3:
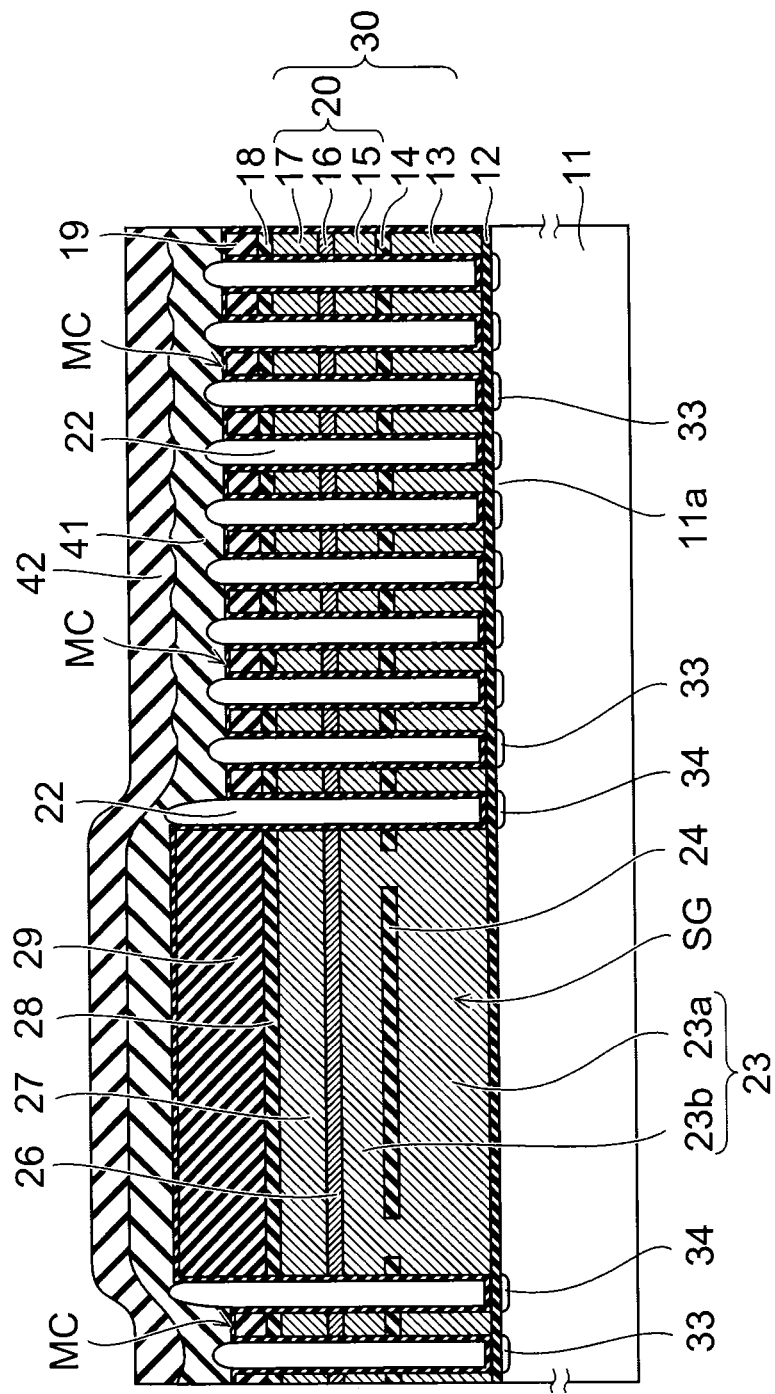

Then, as shown in FIG. 3, the insulating film 42 is formed on the insulating film 41. The insulating film 42 is, for example, a silicon oxide film (a SiO$_2$ film) formed by plasma CVD method. The insulating film 42 is used as a mask of the substrate 11 for patterning the peripheral circuit of the memory cell array region including the memory cells MC.

Figure 4:
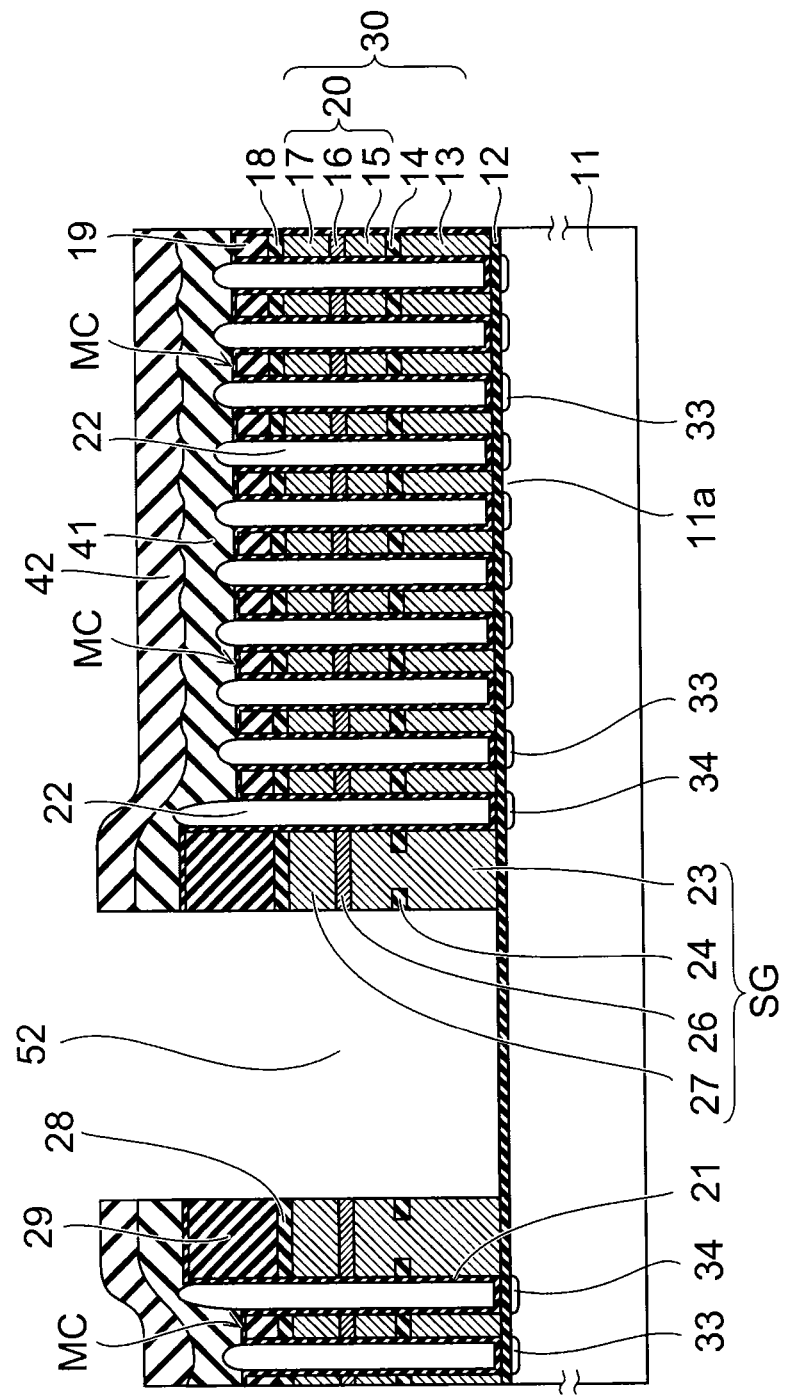

Continuing, a not-shown resist film is formed on the insulating film 42; and after patterning the resist film, as shown in FIG. 4, a trench 52 is made to divide the select gate SG and the stacked film on the select gate SG by removing a portion of the select gate SG and a portion of the stacked film on the select gate SG by etching using the resist film as a mask. The trench 52 divides the two memory strings adjacent to each other in the direction (in FIG. 4, the lateral direction) in which the active region 11a extends.

Figure 5:
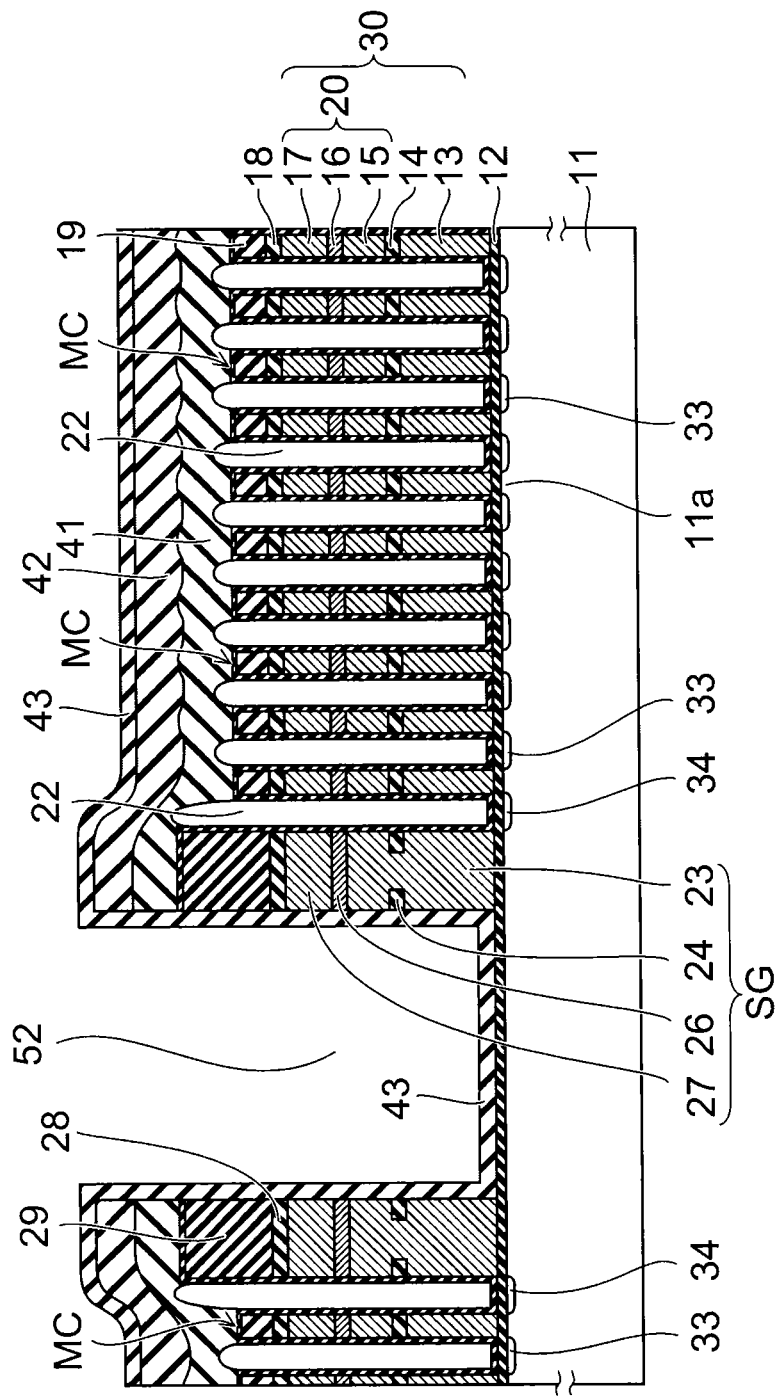

Then, as shown in FIG. 5, a silicon oxide film is formed conformally as the insulating film 43 on the inner walls (the bottom portion and the side wall) of the trench 52 and the top surface of the insulating film 42.

Figure 6:
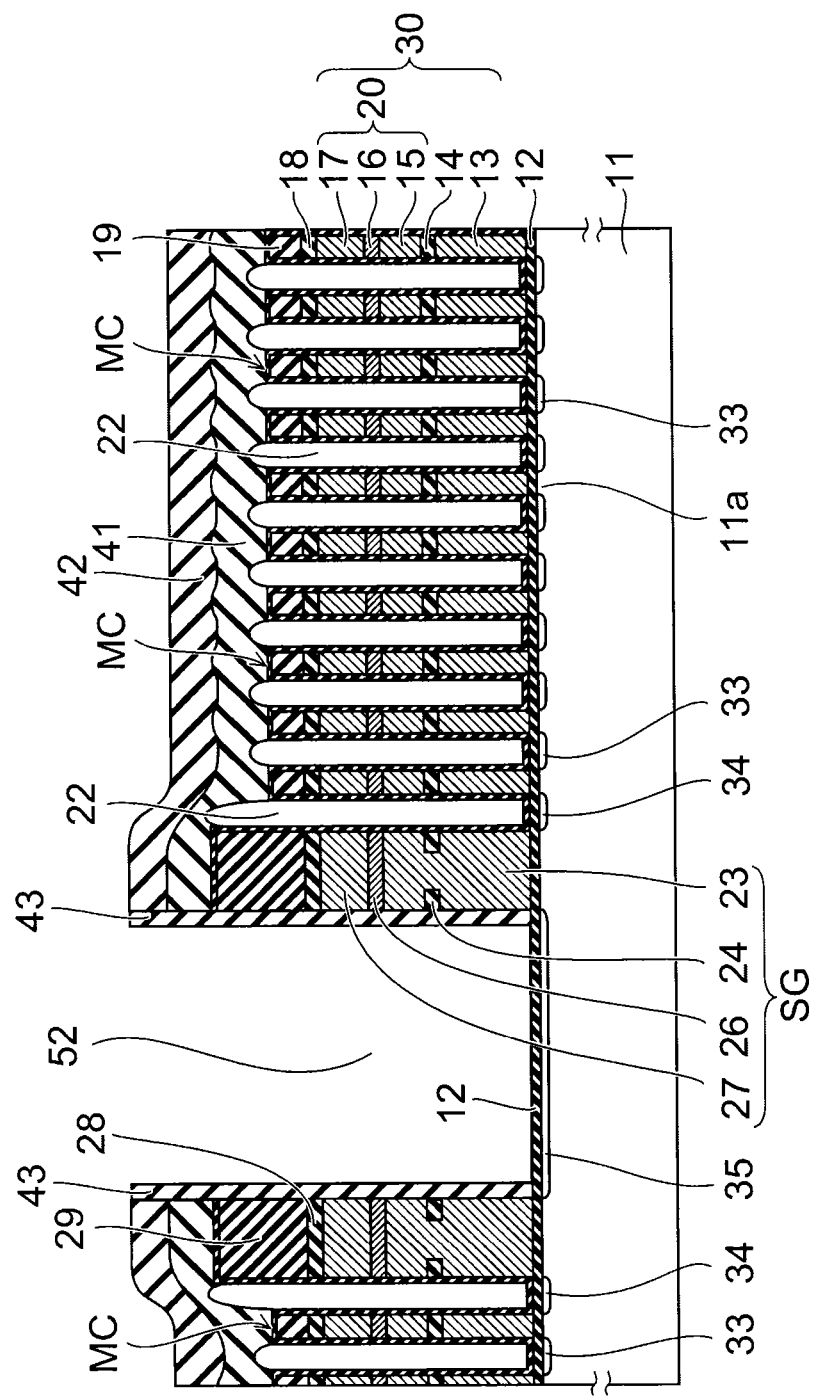

After forming the insulating film 43, the insulating film 43 at the bottom portion of the trench 52 and the insulating film 43 on the insulating film 42 are removed as shown in FIG. 6 by etching the insulating film 43 by RIE (reactive ion etching) method. The insulating film 43 of the side wall of the trench 52 remains.

Subsequently, the source/drain region 35 is formed in the active region 11a under the trench 52 by implanting an impurity into the bottom portion of the trench 52 by ion implantation method.

Figure 7:
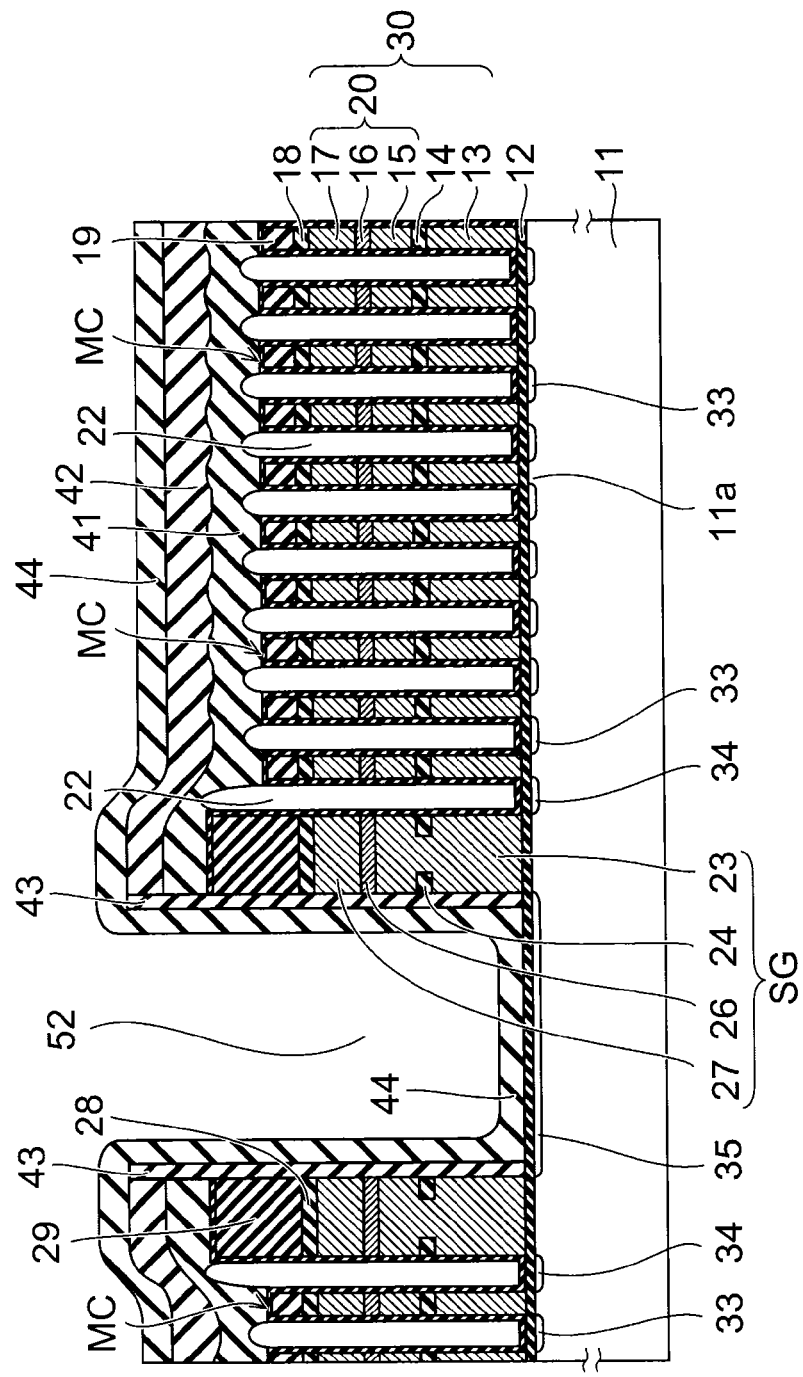

Then, the silicon nitride barrier film 44 is formed conformally as shown in FIG. 7 on the inner walls (the bottom portion and the side wall) of the trench 52 and the top surface of the insulating film 42. The silicon nitride barrier film 44 prevents the impurity diffusion due to the back-end processes.

The silicon nitride barrier film 44 is formed by, for example, thermal CVD method at a temperature not less than 700° C. Because the film is formed by a surface reaction at the film formation surface that is heated to the high temperature in the thermal CVD method, the silicon nitride film formed using the thermal CVD method has excellent coverage; and the silicon nitride barrier film 44 can be formed conformally on the inner walls of the trench 52 without voids between the silicon nitride barrier film 44 and the insulating film 43 of the side wall of the trench 52 and between the silicon nitride barrier film 44 and the insulating film 12 of the bottom portion of the trench 52.

Figure 8:
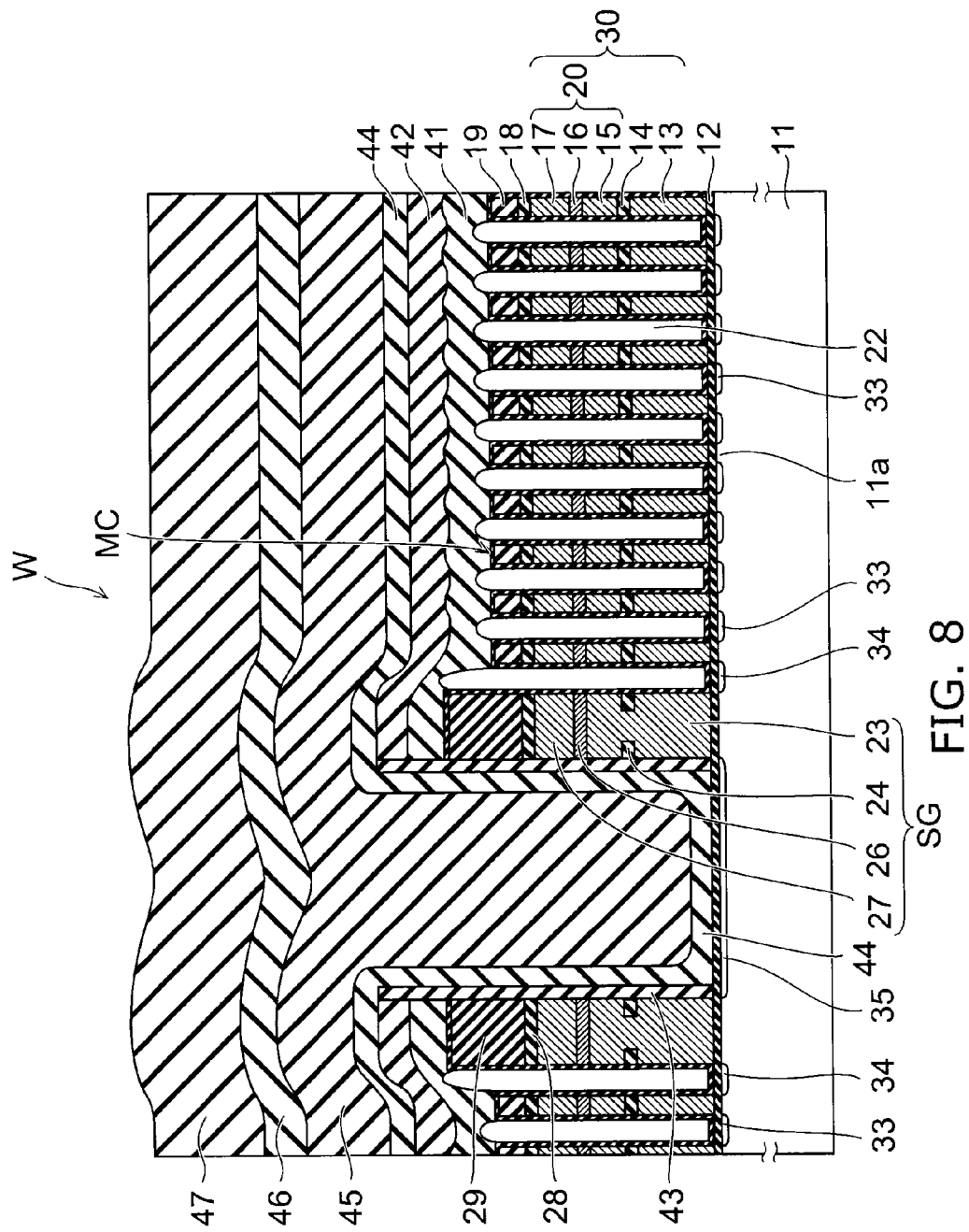

Then, as shown in FIG. 8, the buried film 45 is formed inside the trench 52 and on the silicon nitride barrier film 44. For example, a silicon oxide film (a SiO$_2$ film) is formed as the buried film 45 by thermal CVD method using TEOS (tetraethoxysilane, tetraethylorthosilicate) and O$_3$ as the source gases. For the silicon oxide film formed by the thermal CVD method, conformal growth with high coverage is possible; and the buried film 45 can be filled into the trench 52 without the voids.

Continuing, the silicon nitride film 46 is formed on the buried film 45. The silicon nitride film 46 is formed by, for example, plasma CVD method using SiH$_4$ and N$_2$ or NH$_3$ as the source gases. For the plasma CVD method, film formation is possible at a low temperature (e.g., not more than 400° C.) compared to thermal CVD method.

A wafer W that includes the substrate 11 and the stacked body on the substrate 11 shown in FIG. 8 is placed on one grounded electrode inside a reaction chamber. Then, plasma is generated inside the reaction chamber by applying, for example, RF (high frequency) power of 13.56 MHz to another electrode above the wafer W. The silicon nitride film 46 formed using plasma CVD method has compressive stress. The strength of the compressive stress depends on the RF power. Generally, there is a tendency for the compressive stress of the film that is formed here to increase as the RF power increases. According to the embodiment, the silicon nitride film 46 has compressive stress of about 140 MPa. The silicon nitride film 46 having compressive stress formed by plasma CVD method has a fine film structure; and as shown in Table 1, the Young's modulus of the silicon nitride film 46 is higher than that of the silicon oxide film formed by the plasma CVD method using TEOS gas and is harder than the silicon oxide film formed by the plasma CVD method using the TEOS gas.

TABLE 1

| | thermal CVD SiN film | plasma CVD SiN film | plasma CVD TEOS film |
|---|---|---|---|
| Young's modulus (GPa) | 300 | 240 | 85 |
| film stress (MPa) | 1000 (tensile) | 140 (compressive) | 100 (compressive) |

As shown in Table 1, the silicon nitride film formed by the thermal CVD method does not have compressive stress but has tensile stress.

The film thickness of each of the films compared in Table 1 is 50 nm.

After forming the silicon nitride film 46 having compressive stress, the planarization film 47 is formed on the silicon nitride film 46.

A silicon oxide film (a $SiO_2$ film) is formed as the planarization film 47 by, for example, plasma CVD method using TEOS and $O_2$ as the source gases. The silicon oxide film formed using plasma CVD method can be formed at a rate that is higher than that of thermal CVD method and has excellent productivity.

Figure 9:
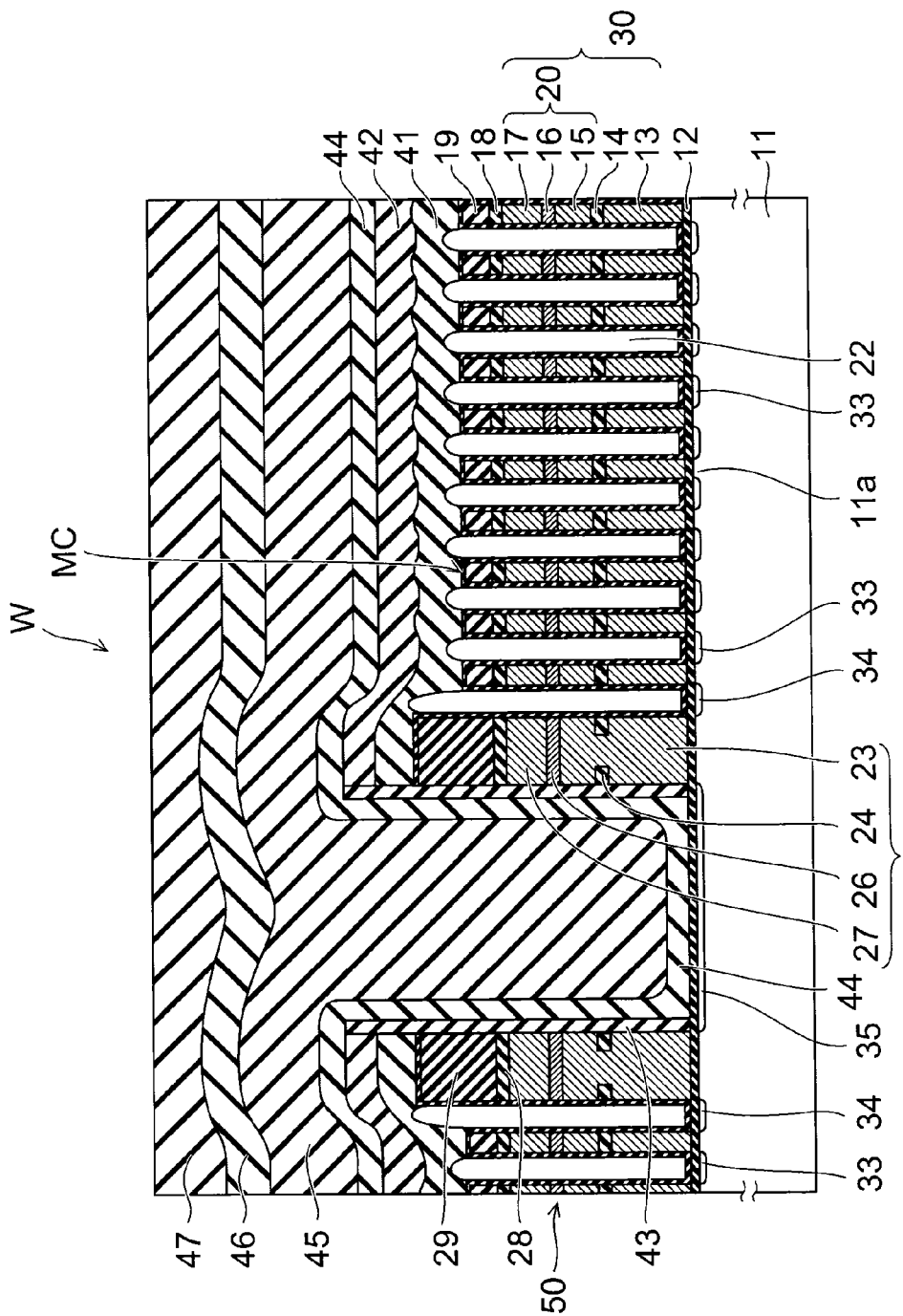

After forming the planarization film 47, the surface of the planarization film 47 is planarized as shown in FIG. 9 by polishing the surface of the planarization film 47 by CMP method. The surface of the planarization film 47 is planarized by so-called blind CMP method in which the polishing is stopped when the planarization film 47 is polished to partway through the planarization film 47 in the film thickness direction without using a stopper film of a type dissimilar to the planarization film 47.

A comparative example will now be described.

Figure 11:
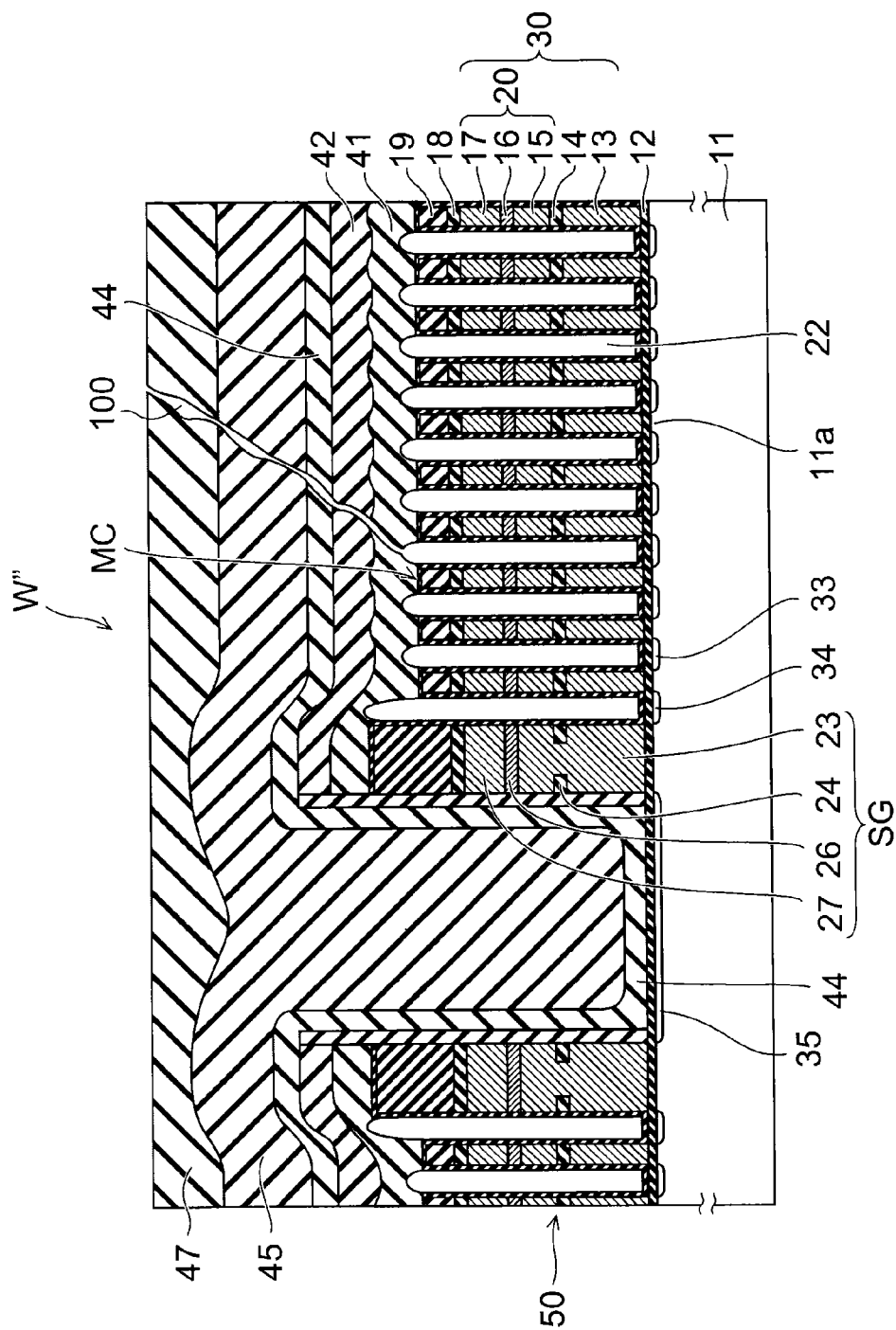
FIG. 11 is a schematic cross-sectional view showing a method for manufacturing a semiconductor device of a comparative example.

FIG. 11 shows the state after the CMP of a wafer W" of the comparative example. The wafer W" of the comparative example differs from the first embodiment recited above in that the silicon nitride film having compressive stress is not provided between the foundation structure 50 and the planarization film 47. In other words, in the comparative example, the planarization film 47 is formed on the buried film 45 without the silicon nitride film having compressive stress being interposed; and the surface of the planarization film 47 is planarized by polishing by blind CMP method.

In the CMP of the planarization film 47 in the comparative example, scratches 100 that occur with the surface of the planarization film 47 as a starting point undesirably reaches the foundation structure 50 by breaking through the planarization film 47, the buried film 45, the silicon nitride barrier film 44, the insulating film 42, and the insulating film 41.

Then, after the CMP, when chemical liquid processing such as, for example, processing (SH processing) using a mixed liquid of sulfuric acid and aqueous hydrogen peroxide is performed to remove the polishing liquid (the slurry) including abrasives such as silica particles, etc., the chemical liquid undesirably penetrates through the scratches 100 to reach the foundation structure 50. Thus the electrode structure 30 may be lost.

Conversely, according to the embodiment, the silicon nitride film 46 has compressive stress, has a Young's modulus that is higher than that of the silicon oxide film, is harder than the silicon oxide film, and is provided between the foundation structure 50 and the planarization film 47. Therefore, even in the case where the scratches occur in the surface of the planarization film 47 during the CMP, the propagation of the scratches to the lower layers can be blocked by the hard silicon nitride film 46. Accordingly, the scratches can be prevented from breaking through the silicon nitride film 46 to reach the foundation structure 50; and the loss of the electrode structure 30 due to the chemical liquid penetrating through the scratches can be prevented.

Compared to the silicon nitride film having tensile stress, the silicon nitride film 46 having compressive stress does not crack easily when the film surface is scratched.

Figure 21:
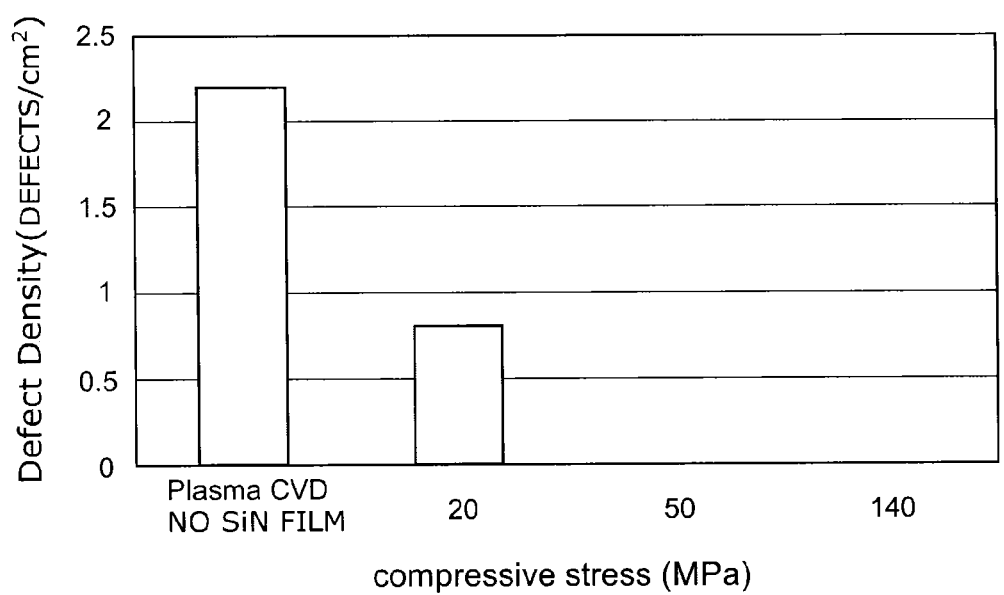
FIG. 21 is a graph showing a relationship between a compressive stress of a silicon nitride film formed by plasma CVD method and a defect density of a lower layer.

FIG. 21 is a graph showing the relationship between the compressive stress of the silicon nitride film 46 formed by plasma CVD method and the defect density of the buried film 45 of the lower layer.

The defect density (defects/cm$^2$) due to the scratches of the buried film 45 after performing the blind CMP of the planarization film 47 was inspected for the structure in which the silicon nitride film formed by plasma CVD method was not provided (the comparative example recited above) and for structures in which the silicon nitride films 46 having compressive stresses of 20 MPa, 50 MPa, and 140 MPa, respectively, were formed by plasma CVD method.

For the comparative example, the planarization film 47 was removed by wet processing after the CMP of the planarization film 47; and the surface of the buried film 45 was inspected. For the structure in which the silicon nitride film 46 was provided, the planarization film 47 and the silicon nitride film 46 were removed by wet processing after the CMP of the planarization film 47; and the surface of the buried film 45 was inspected.

It can be seen from the results of FIG. 21 that it is possible to eliminate the propagation of the scratches to the layers lower than the silicon nitride film 46 during the CMP when the compressive stress of the silicon nitride film 46 is not less than 50 MPa. Accordingly, it is favorable for the compressive stress of the silicon nitride film 46 to be not less than 50 MPa.

The silicon nitride film 46 having compressive stress is formed on the buried film 45. In other words, the silicon nitride film 46 is formed after the trench 52 that divides the memory strings from each other is already filled with the buried film 45. Therefore, the silicon nitride film 46 can be formed by plasma CVD method which has poorer fillability than thermal CVD method; and a large compressive stress caused by the plasma CVD method can be provided to the silicon nitride film 46.

Because the formation of the gap 22 causes the mechanical strength of the foundation structure 50 to be weaker than that of a structure without the gap 22, the cracks may undesirably propagate toward the upper layer with the upper ends of the gaps 22 as starting points due to the pressure received from the polishing pad during the CMP. In such a case as well, according to the embodiment, the propagation of the cracks to the planarization film 47 can be blocked by the hard silicon nitride film 46; and the chemical liquid can be prevented from penetrating to the foundation structure 50 during the SH processing after the CMP.

After the surface of the planarization film 47 is planarized, as shown in FIG. 10, a hole or a trench that reaches the source/drain region 35 is made to pierce the planarization film 47, the silicon nitride film 46, the buried film 45 filled into the trench 52 described above, and the silicon nitride barrier film 44 and the insulating film 12 under the buried film 45; and the via 51 is formed by filling a metal into the hole or the trench.

A not-shown upper layer interconnect (a bit line or a source line) is formed on the planarized top surface of the planarization film 47; and the upper end of the via 51 is connected to the upper layer interconnect.

According to the first embodiment described above, a semiconductor device and a method for manufacturing the semiconductor device having high yield and high reliability can be provided.

Second Embodiment

Figure 20:
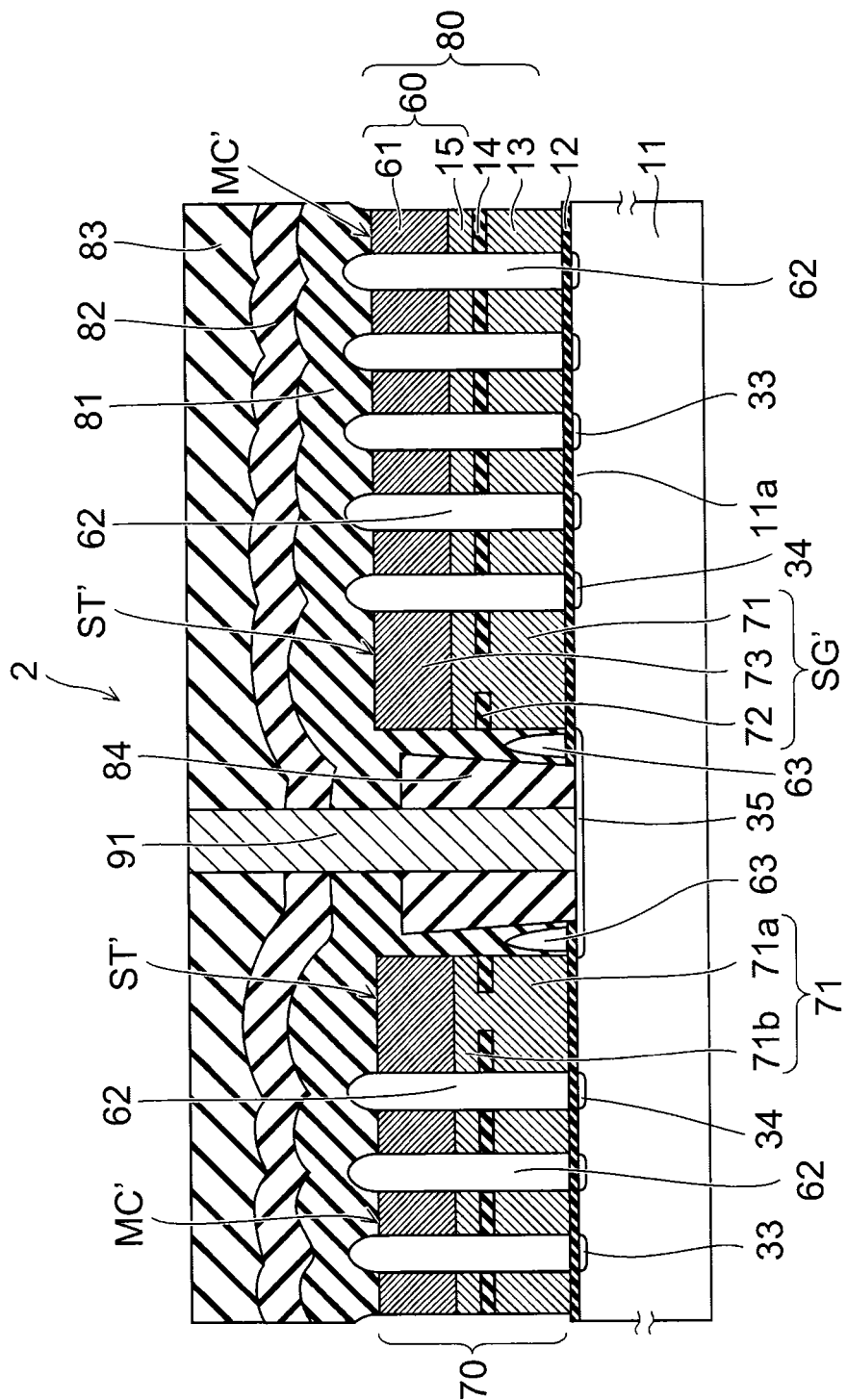

FIG. 20 is a schematic cross-sectional view of a semiconductor device 2 of a second embodiment.

The semiconductor device 2 includes the substrate 11, a foundation structure 70 provided on the substrate 11, and an upper layer structure provided on the foundation structure 70. The semiconductor device 2 is, for example, a nonvolatile semiconductor memory device; and the foundation structure 70 includes multiple memory cells MC' and select transistors ST' as circuit elements. A gap 62 is provided between the memory cells MC' and between the select transistor ST' and the memory cell MC'.

The substrate 11 is, for example, a silicon substrate; and the active region (or the channel region) 11a is formed at the surface of the substrate 11 or at the surface of a semiconductor well layer formed at the surface of the substrate 11. The source/drain regions 33, 34, and 35 having a conductivity type opposite to the active region 11a are formed selectively in the active region 11a.

The insulating film 12 is provided on the active region 11a. The insulating film 12 is, for example, a silicon oxide film. The multiple memory cells MC' are provided on the insulating film 12 and are separated from each other. The memory cell MC' includes an electrode structure 80 provided on the insulating film 12.

The electrode structure 80 includes the charge storage layer 13 provided on the insulating film 12, the intermediate insulating film 14 provided on the charge storage layer 13, and a control electrode 60 provided on the intermediate insulating film 14.

The charge storage layer 13 is a floating electrode, a trap insulating film, or a stacked film of a floating electrode and a trap insulating film. In the description of the second embodiment, a floating electrode made of a polycrystalline silicon layer is described as the charge storage layer 13.

The control electrode 60 includes the polycrystalline silicon layer 15 provided on the intermediate insulating film 14, and a metal silicide layer 61 provided on the polycrystalline silicon layer 15. The metal silicide layer 61 is, for example, a tungsten silicide layer, a cobalt silicide layer, or a nickel silicide layer.

The multiple active regions 11a are formed at the surface of the substrate 11; and each of the active regions 11a extends in the lateral direction of FIG. 20. The active regions 11a and the control electrodes 60 cross (e.g., are orthogonal) when the substrate 11 is viewed in plan from above FIG. 20; and the charge storage layers 13 are positioned at the intersections of the active regions 11a and the control electrodes 60. In other words, the multiple memory cells MC' are laid out in a matrix configuration on the substrate 11; and one memory cell MC includes one charge storage layer 13 enclosed with an insulator (including gaps).

The charge storage layer 13 is covered with the insulator and has no electrical connections. Therefore, even when the power supply is OFF, the electrons stored in the charge storage layer 13 do not leak out from the charge storage layer 13; and new electrons do not enter. In other words, the semiconductor device 2 of the embodiment is a nonvolatile semiconductor memory device that can retain data without supplying the power supply.

The gap 62 having a relative dielectric constant that is lower than that of the silicon oxide film is provided between the multiple memory cells MC' to suppress the interference between the memory cells MC'.

The multiple memory cells MC' are connected in series in the direction (in FIG. 20, the lateral direction) in which the active region 11a extends and are included in a cell column. The mutually-adjacent memory cells MC' share the source/drain region 33 formed in the active region 11a.

The select transistors ST' including select gates SG' are connected at the two ends of the cell column. The cell column and the select transistors ST' are connected in series between a not-shown bit line and a not-shown source line and are included in a memory string.

The select gate SG' includes a polycrystalline silicon layer 71 provided on the insulating film 12, and a metal silicide layer 73 provided on the polycrystalline silicon layer 71.

The polycrystalline silicon layer 71 includes a lower layer portion 71a formed by the same process as the charge storage layer (the floating electrode) 13 of the memory cell MC', and an upper layer portion 71b formed by the same process as the polycrystalline silicon layer 15 of the memory cell MC'.

An intermediate insulating film 72 formed by the same process as the intermediate insulating film 14 of the memory cell MC' is provided between the lower layer portion 71a and the upper layer portion 71b of the polycrystalline silicon layer 71 of the select gate SG'. However, in the select gate SG', a portion of the intermediate insulating film 72 has an opening; and the upper layer portion 71b and the lower layer portion 71a of the polycrystalline silicon layer 71 are shorted to each other.

The metal silicide layer 73 of the select gate SG' is formed of the same material as the metal silicide layer 61 of the memory cell MC' and by the same process as the metal silicide layer 61 of the memory cell MC'.

The select gate SG' is provided on the active region 11a between mutually-adjacent cell columns with the insulating film 12 interposed between the select gate SG' and the active region 11a.

The source/drain region 35 is formed in the active region 11a between the mutually-adjacent select gates SG'. The source/drain region 34 is formed in the active region 11a between the select gate SG' and the memory cell MC' of the end of the cell column.

A pair of the select gates SG' is provided with the source/drain region 35 interposed; and the select gates SG' make it possible to respectively connect different cell columns to a common upper layer interconnect (a bit line or a source line).

A via 91 that reaches the source/drain region 35 is provided in an insulating film 81 and in a buried film 84 described below that is provided between the mutually-adjacent select gates SG. The memory string is electrically connectable to the not-shown upper layer interconnect (the bit line or the source line) by the via 91.

The buried film 84 is provided between the mutually-adjacent select gates SG'. The buried film 84 is an insulating film, e.g., a silicon oxide film.

A portion of the insulating film 81 is provided between the buried film 84 and the side wall of the select gate SG'. The insulating film 81 is, for example, a silicon oxide film.

The insulating film 81 is provided also on the foundation structure 70. By controlling the film formation conditions of the insulating film 81, the insulating film 81 can be formed on the memory cells MC' and on the select gates SG' to cause the gap 62 to occur between the memory cells MC' and between the select gate SG' and the memory cell MC'.

A silicon nitride film 82 is provided on the insulating film 81. As described below, the silicon nitride film 82 is formed by plasma CVD method and has compressive stress. The Young's modulus of the silicon nitride film 82 is higher than that of the silicon oxide film; and the silicon nitride film 82 is harder than the silicon oxide film.

A planarization film 83 is provided on the silicon nitride film 82. The planarization film 83 is, for example, a silicon oxide film. The surface (the top surface) of the planarization film 83 is planarized by polishing by CMP method as described below.

The method for manufacturing the semiconductor device 2 of the second embodiment will now be described with reference to FIGS. 12 to 20.

Figure 12:
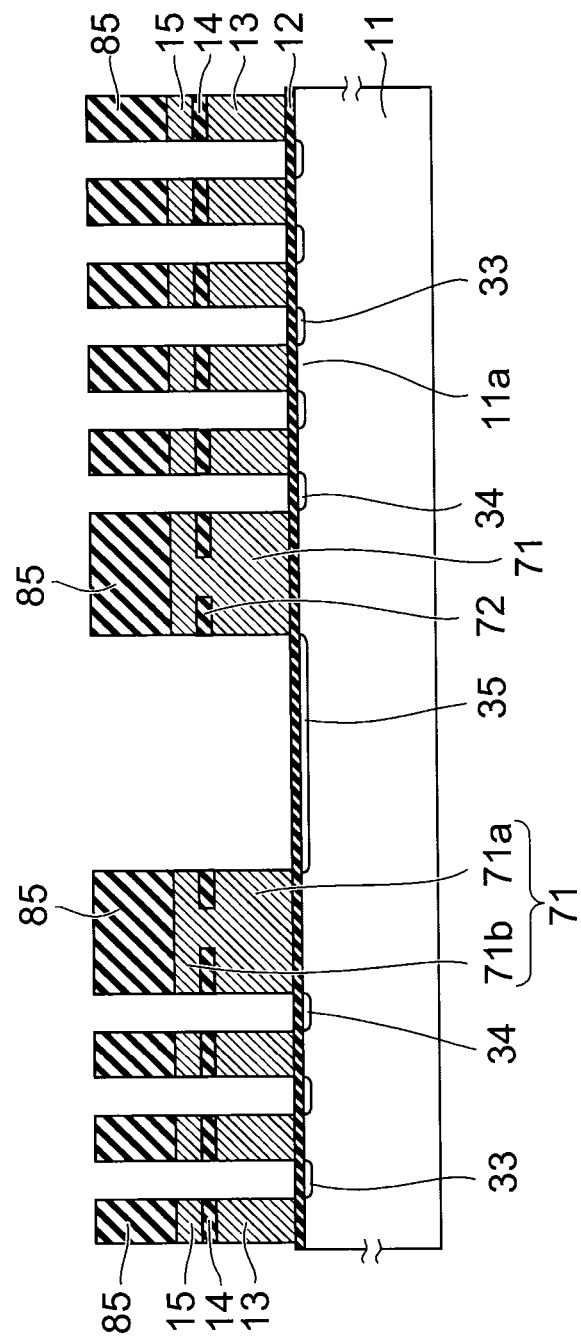
FIGS. 12 to 20 are schematic cross-sectional views showing a method for manufacturing a semiconductor device of a second embodiment.

As shown in FIG. 12, after forming the active region 11a at the surface of the substrate 11, the insulating film 12 is formed on the active region 11a.

A polycrystalline silicon layer that is used to form the charge storage layer 13 of the memory cell MC' and the lower layer portion 71a of the polycrystalline silicon layer 71 of the select gate SG' is formed on the insulating film 12.

An insulating film that is used to form the intermediate insulating film 14 of the memory cell MC' and the intermediate insulating film 72 of the select gate SG' is formed on the polycrystalline silicon layer. A portion of the intermediate insulating film 72 has an opening.

A polycrystalline silicon that is used to form the polycrystalline silicon layer 15 of the memory cell MC' and the upper layer portion 71b of the polycrystalline silicon layer 71 of the select gate SG is formed on the intermediate insulating film 72. The polycrystalline silicon is filled also into the opening made in the intermediate insulating film 72.

For example, a silicon nitride film is formed as a mask layer 85 on the polycrystalline silicon.

Then, a not-shown resist film is formed on the mask layer 85; after patterning the resist film, the stacked body described above under the resist film is divided into a plurality as shown in FIG. 12 by progressively etching using the resist film as a mask.

Continuing, the source/drain regions 33, 34, and 35 are formed by implanting an impurity into the active region 11a by ion implantation using the stacked bodies as a mask.

Figure 13:
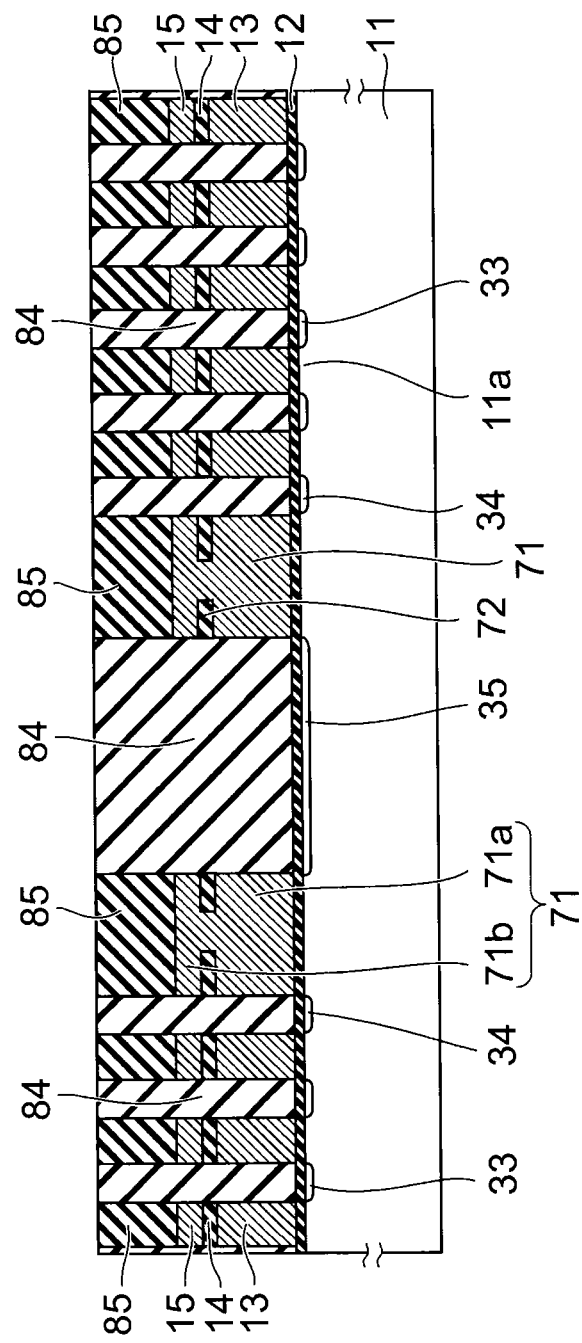

Then, as shown in FIG. 13, the buried film 84 is filled between the multiple stacked bodies. After being deposited also on the mask layer 85, the buried film 84 is polished by CMP method; and the top surface of the mask layer 85 is exposed. The buried film 84 is, for example, a silicon oxide film.

Figure 14:
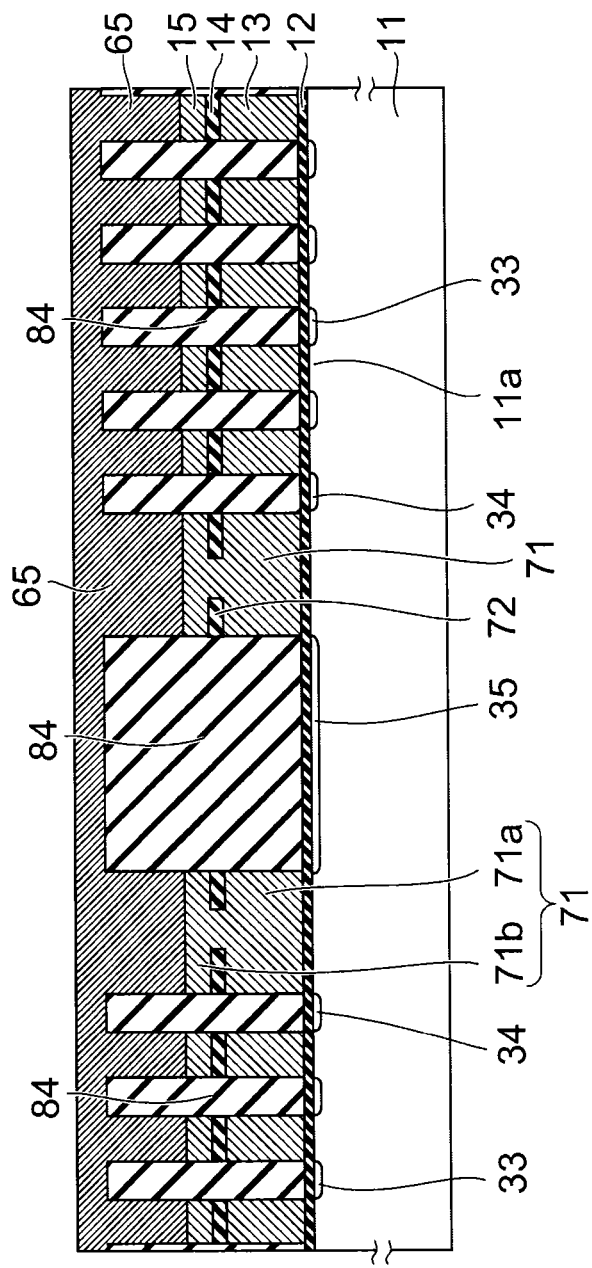

Continuing, after removing the mask layer 85 as shown in FIG. 14, a metal film 65 is formed on the polycrystalline silicon layer 15, on the polycrystalline silicon layer 71, and on the buried film 84. The metal film 65 is a tungsten film, a cobalt film, or a nickel film.

Figure 15:
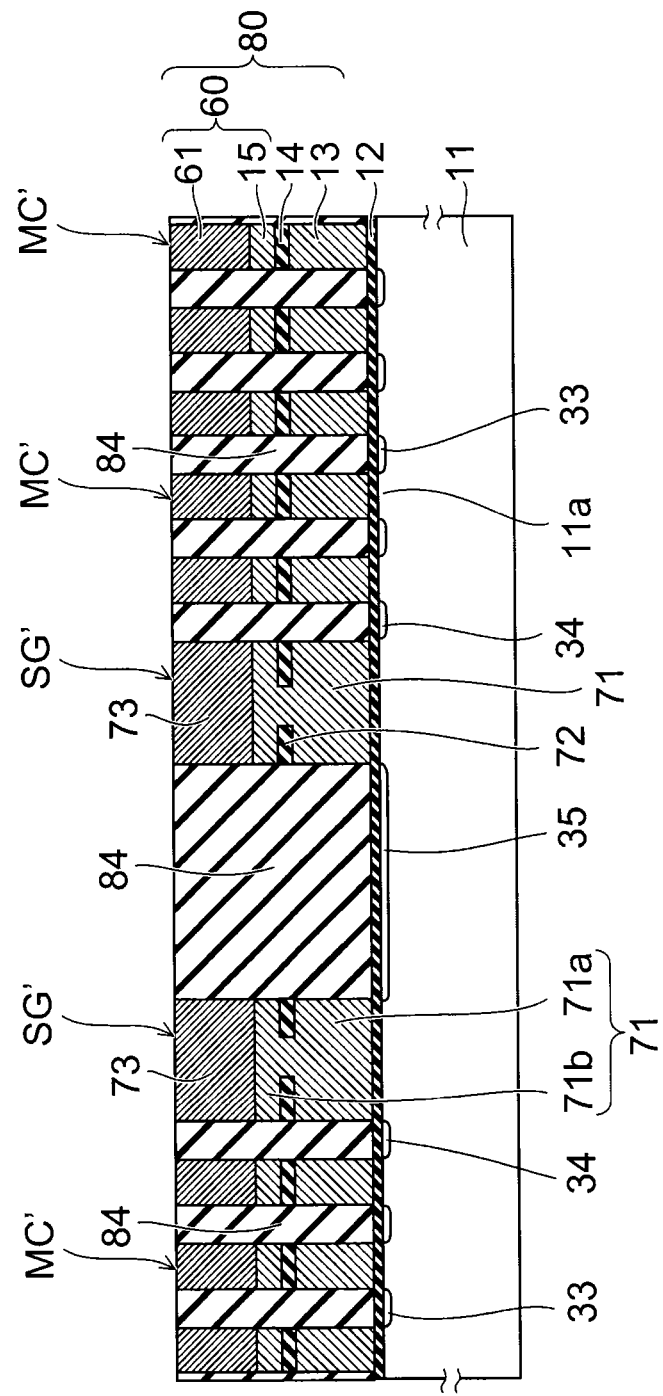

Then, by heating the stacked body shown in FIG. 14, the polycrystalline silicon layers 15 and 71 and the metal layer 65 are caused to react to form the metal silicide layer 61 on the polycrystalline silicon layer 15 and the metal silicide layer 73 on the polycrystalline silicon layer 71 as shown in FIG. 15. Subsequently, the unreacted metal layer 65 is removed.

Then, wet etching of the buried film 84 is performed. By the wet etching as shown in FIG. 16, the gap 62 is made between the memory cells MC'; and the gap 62 is made also between the select gate SG' and the memory cell MC'.

The spacing between the mutually-adjacent select gates SG' is larger than the spacing between the memory cells MC'; and the width of the buried film 84 provided between the select gates SG' is wider than the width of the buried film 84 provided between the memory cells MC'. Therefore, only a portion of the buried film 84 between the select gates SG' is removed by the wet etching recited above; and a portion of the buried film 84 remains between the select gates SG'. A gap 63 is made between the buried film 84 that remains and the side wall of the select gate SG'.

Figure 16:
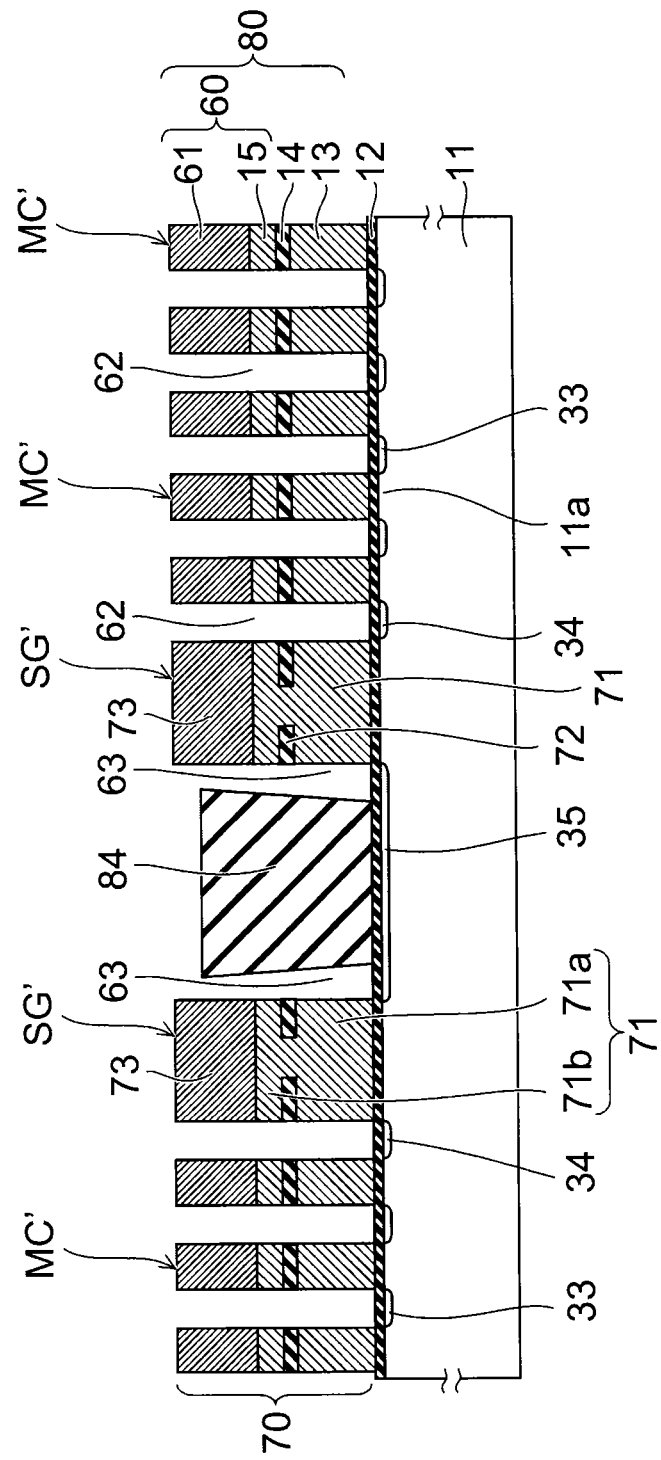
Figure 17:
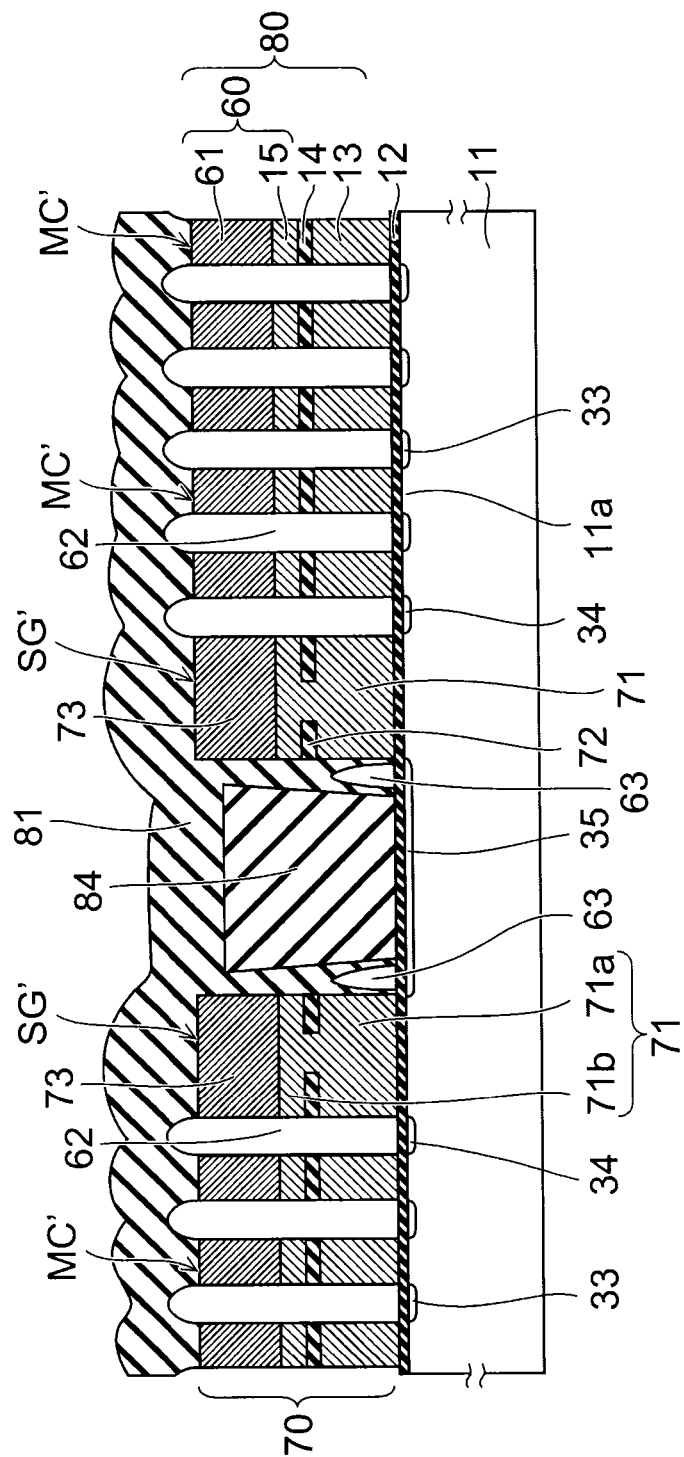

Then, as shown in FIG. 17, the insulating film 81 is formed on the foundation structure 70 obtained in FIG. 16. By controlling the film formation conditions of the insulating film 81, the insulating film 81 can be formed on the memory cells MC' and on the select gates SG' to make the gap 62 between the memory cells MC' and between the select gate SG' and the memory cell MC'.

The gap 63 is formed at a portion (the lower portion) between the select gate SG' and the buried film 84.

A silicon oxide film (a $SiO_2$ film) is formed as the insulating film 81 by, for example, plasma CVD method using the $SiH_4$ and $N_2O$ as the source gases. The silicon oxide film formed by this film formation method has poor fillability into trenches and holes; and the formation of the gap 62 is possible.

Or, the formation of the gap 62 is possible even in the case where a SiON film is formed by plasma CVD method as the insulating film 81.

Figure 18:
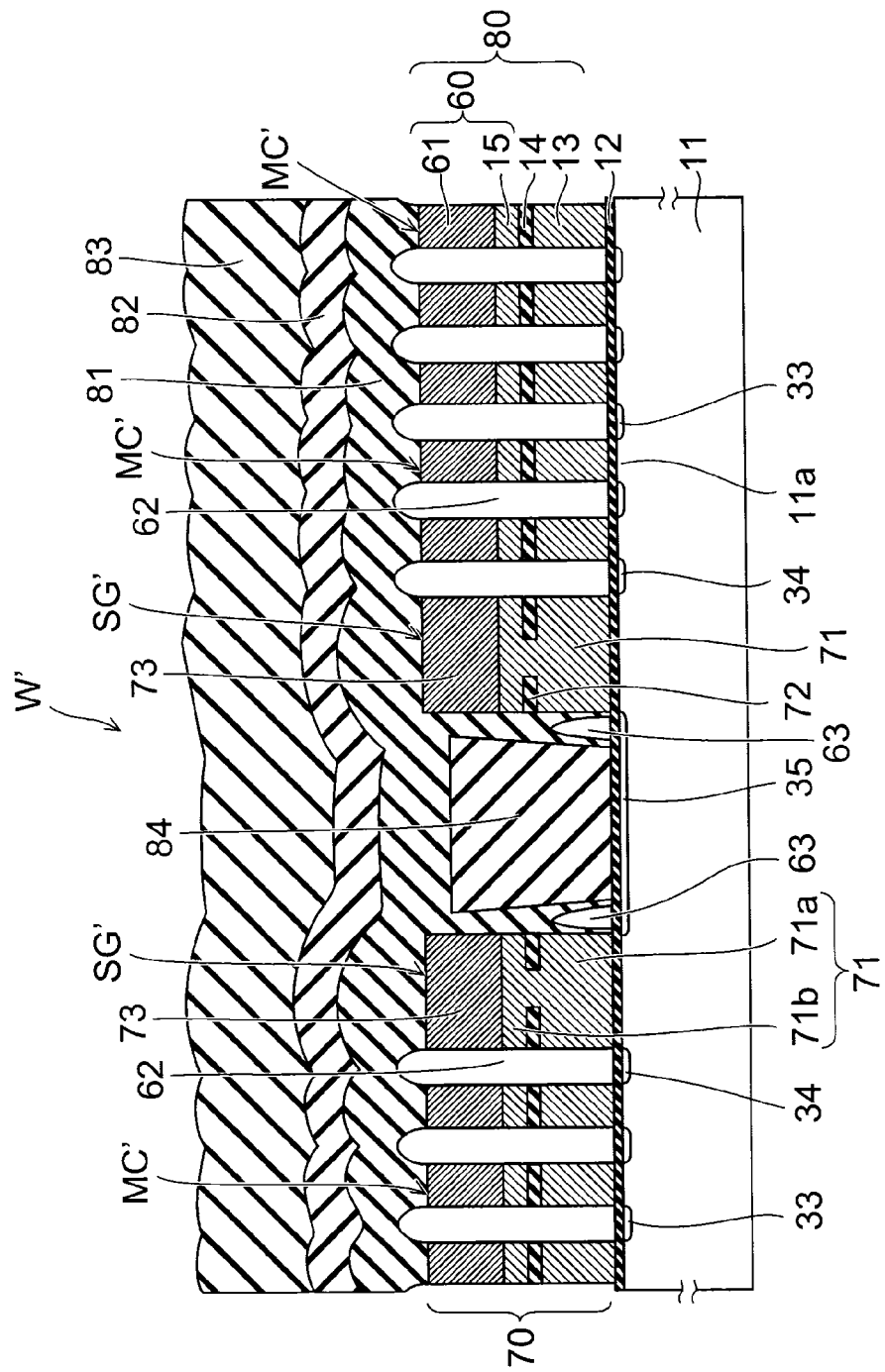

Then, as shown in FIG. 18, the silicon nitride film 82 is formed on the insulating film 81. The silicon nitride film 82 is formed by, for example, plasma CVD method using $SiH_4$ and $N_2$ or $NH_3$ as the source gases. For the plasma CVD method, the film formation is possible at a low temperature (e.g., not more than 400° C.) compared to the thermal CVD method.

A wafer W' that includes the substrate 11 and the stacked body on the substrate 11 shown in FIG. 18 is placed on one grounded electrode inside a reaction chamber. Then, plasma is generated inside the reaction chamber by applying, for example, RF (high frequency) power of 13.56 MHz to another electrode above the wafer W'. The silicon nitride film 82 formed using the plasma CVD method has compressive stress. The strength of the compressive stress depends on the RF power. Generally, there is a tendency for the compressive stress of the film that is formed here to increase as the RF power increases. According to the second embodiment, the silicon nitride film 82 has compressive stress of about 140 MPa.

The silicon nitride film 82 having compressive stress formed by plasma CVD method has a fine film structure; the Young's modulus of the silicon nitride film 82 is higher than that of the silicon oxide film; and the silicon nitride film 82 is harder than the silicon oxide film.

After forming the silicon nitride film 82 having compressive stress, the planarization film 83 is formed on the silicon nitride film 82.

A silicon oxide film (a $SiO_2$ film) is formed as the planarization film 83 by, for example, plasma CVD method using TEOS and $O_2$ as the source gases. The silicon oxide film formed using the plasma CVD method can be formed at a rate higher than that of thermal CVD method and has excellent productivity.

Figure 19:
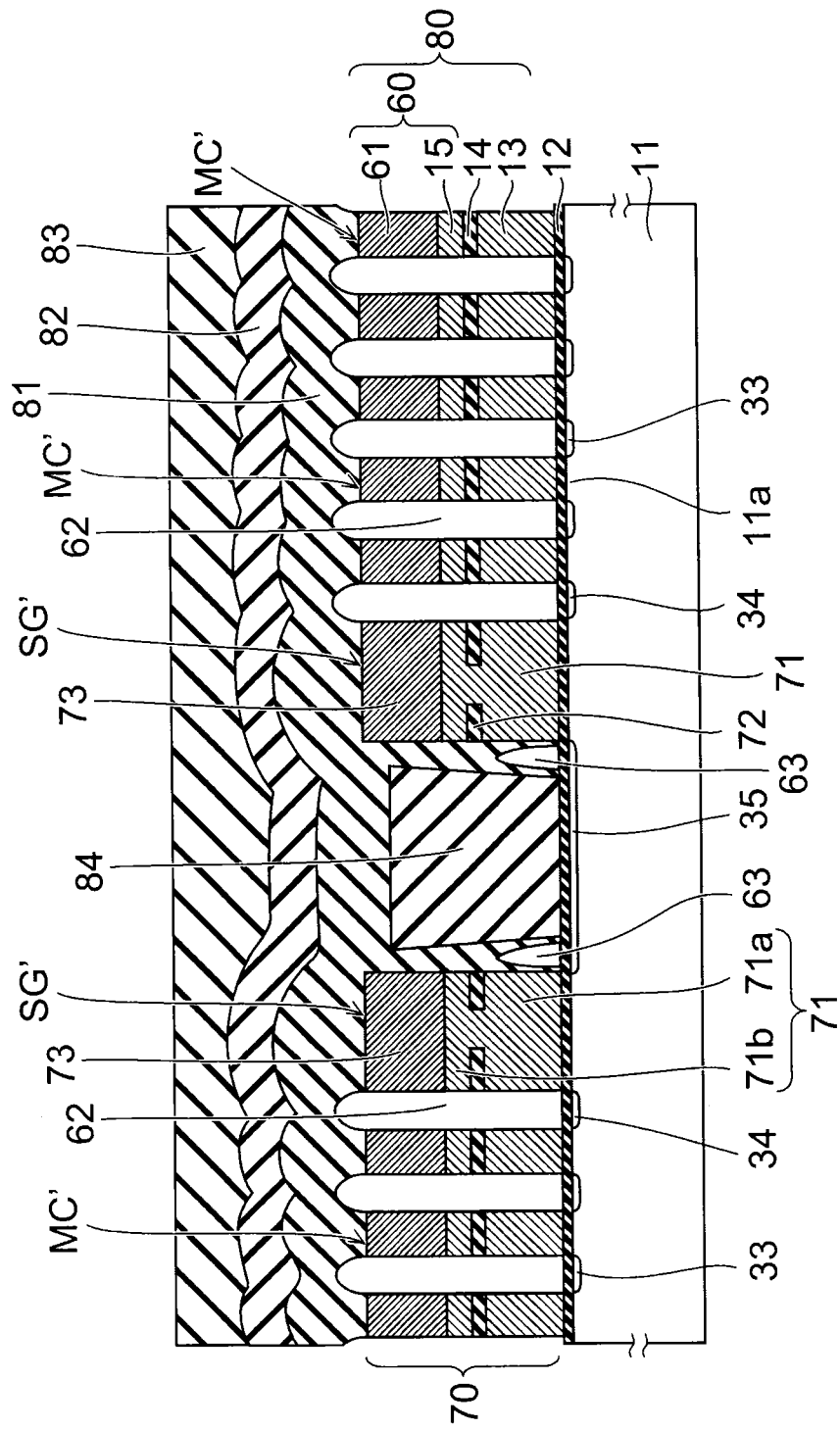

After forming the planarization film 83, the surface of the planarization film 83 is planarized as shown in FIG. 19 by polishing the surface of the planarization film 83 by CMP method. The surface of the planarization film 83 is planarized by so-called blind CMP method in which the polishing is stopped when the planarization film 83 is polished to partway through the planarization film 83 in the film thickness direction without using a stopper film of a type dissimilar to the planarization film 83.

In the second embodiment as well, similarly to the first embodiment, the silicon nitride film 82 has compressive stress, has a Young's modulus that is higher than that of the silicon oxide film, is harder than the silicon oxide film, and is provided between the foundation structure 70 and the planarization film 83. Therefore, even in the case where the scratches occur in the surface of the planarization film 83 during the CMP, the propagation of the scratches to the lower layers can be blocked by the silicon nitride film 82. Accordingly, the scratches can be prevented from breaking through the silicon nitride film 82 to reach the foundation structure 70; and the loss of the electrode structure 80 due to the chemical liquid penetrating through the scratches can be prevented.

In the second embodiment as well, similarly to the first embodiment, high blocking effects of the scratch propagation can be obtained by the compressive stress of the silicon nitride film 82 being not less than 50 MPa.

Because the formation of the gap 62 causes the mechanical strength of the foundation structure 70 to be weaker than that of a structure without the gap 62, the cracks may undesirably propagate toward the upper layer with the upper ends of the gaps 62 as starting points due to the pressure received from the polishing pad during the CMP. In such a case as well, according to the second embodiment, the propagation of the cracks to the planarization film 83 can be blocked by the hard silicon nitride film 82; and the chemical liquid can be prevented from penetrating to the foundation structure 70 during the SH processing after the CMP.

After the surface of the planarization film 83 is planarized, as shown in FIG. 20, a hole or a trench that reaches the source/drain region 35 is made to pierce the planarization film 83, the silicon nitride film 82, the insulating film 81, and the buried film 84 between the select gates SG'; and the via 91 is formed by filling a metal into the hole or the trench.

A not-shown upper layer interconnect (a bit line or a source line) is formed on the planarized upper surface of the planarization film 83; and the upper end of the via 91 is connected to the upper layer interconnect.

According to the second embodiment described above, a semiconductor device and a method for manufacturing the semiconductor device having high yield and high reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
   forming a plurality of electrode structures above a substrate;
   forming an insulating film on the plurality of electrode structures to make a gap between mutually-adjacent electrode structures;
   forming a silicon nitride film having compressive stress above the insulating film;
   forming a planarization film above the silicon nitride film; and
   planarizing a surface of the planarization film by polishing by CMP (chemical mechanical polishing) method; wherein
   the forming of the electrode structures includes:
      forming a charge storage layer above the substrate;
      forming an intermediate insulating film above the charge storage layer; and
      forming a control electrode above the intermediate insulating film;
   the forming of the control electrode includes:
      forming a silicon layer above the intermediate insulating film; and
      forming a metal layer above the silicon layer;
   a trench is formed above the substrate by removing a portion of the insulating film and a portion of the electrode structures after the forming of the insulating film on the electrode structures;
   a silicon nitride barrier film is formed above the insulating film and at an inner wall of the trench;
   a buried film is formed inside the trench and above the silicon nitride barrier film;
   the silicon nitride film having the compressive stress is formed above the buried film; and
   a silicon oxide film is formed as the buried film by thermal CVD method.

2. The method for manufacturing the semiconductor device according to claim 1, wherein the silicon nitride film has compressive stress not less than 50 MPa.

3. The method for manufacturing the semiconductor device according to claim 1, wherein the silicon nitride film is formed by plasma CVD (chemical vapor deposition) method.

4. The method for manufacturing the semiconductor device according to claim 1, wherein the polishing is stopped when the planarization film is polished to partway through the planarization film in a film thickness direction without using a stopper film of a type dissimilar to the planarization film.

5. The method for manufacturing the semiconductor device according to claim 1, wherein the silicon nitride barrier film is formed by thermal CVD method.

6. The method for manufacturing the semiconductor device according to claim 1, wherein the silicon nitride barrier film is formed conformally above the insulating film and at the inner wall of the trench.

7. The method for manufacturing the semiconductor device according to claim 1, wherein a silicon oxide film is formed as the planarization film by plasma CVD method.

* * * * *